United States Patent [19]

Arai et al.

[11] Patent Number: 4,765,847

[45] Date of Patent: Aug. 23, 1988

[54] METHOD OF TREATING THE SURFACE OF IRON ALLOY MATERIALS

[75] Inventors: Tohru Arai; Hironori Fujita; Junji Endo; Yoshihiko Sugimoto; Yukio Ohta, all of Aichi, Japan

[73] Assignee: Kabushiki Kaisha Toyota Chuo Kenkyusho, Japan

[21] Appl. No.: 23,862

[22] PCT Filed: Jun. 9, 1986

[86] PCT No.: PCT/JP86/00287

§ 371 Date: Feb. 3, 1987

§ 102(e) Date: Feb. 3, 1987

[87] PCT Pub. No.: WO86/07614

PCT Pub. Date: Dec. 31, 1986

[30] Foreign Application Priority Data

Jun. 17, 1985 [JP] Japan .................................. 60-131556
Aug. 14, 1985 [JP] Japan .................................. 60-178781
Sep. 24, 1985 [JP] Japan .................................. 60-210495
Sep. 24, 1985 [JP] Japan .................................. 60-210496

[51] Int. Cl.$^4$ .............................................. C23C 9/10
[52] U.S. Cl. .................................... 148/15.5; 148/16.6

[58] Field of Search ................... 148/16, 16.6, 16.7, 148/15, 15.5, 14, 19

[56] References Cited

U.S. PATENT DOCUMENTS 4,158,578 6/1979 Komatsu et al. .................. 148/6.11

FOREIGN PATENT DOCUMENTS 122529 10/1984 European Pat. Off. .

Primary Examiner—Christopher W. Brody
Attorney, Agent, or Firm—Berman, Aisenberg & Platt

[57] ABSTRACT

A layer of a nitride or carbonitride containing at least one of chromium, Group Va elements, titanium and zirconium is formed on the surface of an iron alloy material which has been nitrided. The layer is formed by heating the iron alloy material at a temperature not exceeding 700° C. with a material containing at least one of chromium, Group Va elements, titanium and zirconium and a treating agent. It is a dense layer bonded tightly to the iron alloy material. As a low temperature not exceeding 700° C. is employed, no large amount of heat energy is required, nor is any thermal strain produced in the iron alloy material.

20 Claims, 15 Drawing Sheets (×400)

(×400)

(×400)

(×400)

(×400)

(×400)

(×400)

(×400)

(×400)

(x400)

(x400)

(x400)

(x400)

METHOD OF TREATING THE SURFACE OF IRON ALLOY MATERIALS

BACKGROUND OF THE INVENTION

1. Field of the Invention

This invention relates to a method of treating the surface of an iron alloy material, as for making dies, jigs, tools or machine parts, to form thereon a layer composed of a nitride or carbonitride of one or more of the surface layer-forming elements, i.e., chromium, Group Va metals (vanadium, niobium and tantalum), titanium and zirconium.

2. Description of the Prior Art

It is well known that if the surface of an iron alloy material is covered with a layer composed of a carbide, nitride or carbonitride of one or more of the surface layer-forming elements, it improves the wear, seizure, oxidation and corrosion resistances and other properties of the iron alloy material. There have been proposed many methods for forming such a surface layer.

For example, a layer of chromium carbide is formed on a iron alloy material by immersion in a salt bath composed of a chloride (see Japanese Laid-Open Patent Specification No. 200555/1982 or 197264/1983). An iron alloy material which has been nitrided is chromized, whereby a layer of chromium carbonitride is formed on its surface (see Japanese Patent Publication No. 24967/1967 or U.S. Pat. No. 4,242,151).

Both of these methods, however, involve heating at a temperature which is higher than the $Ac_1$ transformation point of iron (about 700° C.). The heat develops strain in the iron alloy material and if it has a complicated shape, it is very likely to crack. The use of such a high temperature presents other problems, too, including the worsening of the working environment.

There have, therefore, been proposed a number of methods for forming a surface layer at a temperature not exceeding 700° C. They employ, for example, a halide of the surface layer-forming element or elements and form a surface layer by, for example, CVD (chemical vapor deposition), plasma CVD, ion plating or PVD (physical vapor deposition) [see, for example, Japanese Laid-Open Patent Specification No. 65357/1980, 154563/1980 or 151469/1983, "Kinzoku Hyomen Gijutsu" (Metal Surface Technology), No. 2, p.28 (1979), or Japanese Laid-Open Patent Specification No. 2715/1980 or 164072/1980].

Although all of these methods can form a surface layer on an iron alloy material without producing any thermal strain, they can hardly form a surface layer which is satisfactory from the standpoints of thickness uniformity and adhesive strength. All of them are complicated and require expensive equipment. Moreover, they are inefficient, as they need be carried out in the presence of hydrogen or at a reduced pressure.

SUMMARY OF THE INVENTION

It is, therefore, an object of this invention to provide a method which can form on the surface of an iron alloy material a layer composed of a nitride or carbonitride of one or more surface layer-forming elements and adhering strongly to the base material efficiently at a low temperature by means of a very simple apparatus without producing any thermal strain in the base material.

It is another object of this invention to provide a method which can form such a surface layer at a low temperature without requiring a large amount of energy, and which is, therefore, easy to carry out.

These objects are attained by a method which comprises nitriding an iron alloy material to form on its surface a layer of a nitride composed of iron and nitrogen, or iron, carbon and nitrogen, and heating the iron alloy material at a temperature not exceeding 700° C. with a material containing one or more surface layer-forming elements selected from the group consisting of chromium, Group Va metals, titanium and zirconium, and a treating agent to diffuse the surface layer-forming element or elements into the surface of the iron alloy material to form thereon a layer composed of a nitride or carbonitride of the surface layer-forming element or elements, the treating agent being composed of at least one of the chlorides, borofluorides, fluorides, oxides, bromides, iodides, carbonates, nitrates and borates of alkali and alkaline earth metals and/or an ammonium halide or a metal halide or both.

Other objects, features and advantages of this invention will become apparent from the following detailed description and the accompanying drawings.

DETAILED DESCRIPTION OF THE INVENTION

Figure 1:
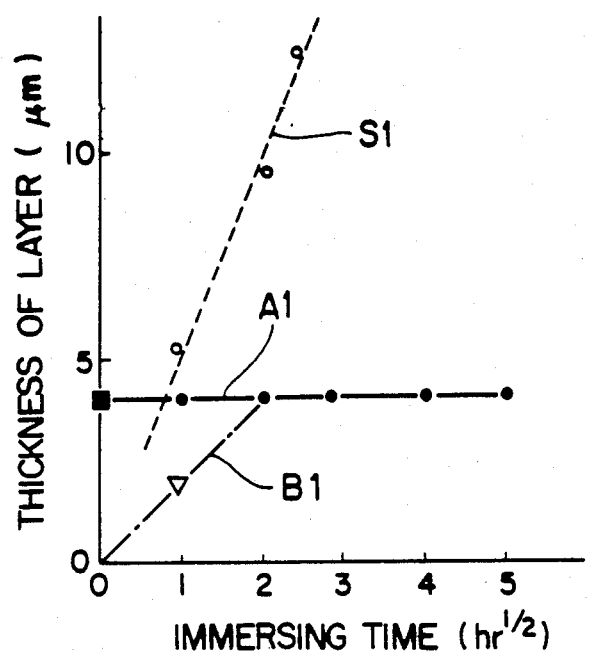
FIGS. 1, 13, 25 and 32 are graphs showing the thickness of the surface layers formed in EXAMPLES 1, 13, 26 and 38, respectively, in relation to the immersing time employed.

According to this invention, a layer composed of a nitride or carbonitride of one or more surface layer-forming elements is formed on the surface of an iron alloy material. The term "iron alloy material" as herein used means not only a material containing carbon, such as carbon or alloy steel, cast iron or a sintered alloy, but also a material hardly containing carbon, such as pure iron. If the material to be treated has a high carbon content, the resulting carbonitride layer contains a correspondingly large amount of carbon. Therefore, a surface layer having a high carbon content can be formed if the carbon content of the surface portion of the material to be treated is increased by carburization or otherwise prior to, or during, nitriding. In case the material to be treated is industrial pure iron, the carbon which it contains only in a very small quantity is the carbon which the resulting carbonitride layer will contain.

The iron alloy material is, first, nitrided. The nitriding is the treatment which causes the diffusion of nitrogen through the surface of the iron alloy material to form a nitride layer thereon. The nitride layer is composed of iron nitride formed by the reaction of iron and nitrogen, or iron carbonitride formed by the reaction of iron, nitrogen and the carbon in the material. A layer of a solid solution of nitrogen in iron (diffusion layer) is formed immediately under the nitride layer. Then, the material is heated with a material containing a surface layer-forming element so that the element may be diffused through the nitride layer and replace the iron which it contains. If the nitride layer is a layer of iron carbonitride, a layer composed of the carbonitride of the surface layer-forming element is formed on the surface of the iron alloy material. If it is a layer of iron nitride, the resulting surface layer is composed of the nitride of the surface layer-forming element. The maximum thickness of the surface layer which can be formed on the nitrided iron alloy material is equal to the thickness of the nitride layer. Therefore, the nitriding treatment defines the thickness of the surface layer which can be formed.

The nitride layer can be formed by any nitriding method, for example, gas nitriding or soft-nitriding, salt bath soft-nitriding or glow discharge nitriding. It is preferable that the nitride layer have a high nitride concentration and a large thickness. The most preferable thickness of the nitride layer is from 3 to 15 microns. If the thickness of the nitride layer is too small, the nitride or carbonitride of the surface layer-forming element employed forms a layer having an unsatisfactorily small thickness. If the thickness of the nitride layer is too large, it is likely to lower the toughness of the iron alloy material.

After the iron alloy material has been nitrided, it is heated with a material containing one or more surface layer-forming elements, so that the element or elements may be diffused into the surface of the iron alloy material to form a layer of its nitride or carbonitride thereon.

The material containing one or more surface layer-forming elements is used to supply the element or elements which are diffused into the surface of the iron alloy material. One or more elements are selected from among chromium, Group Va elements (vanadium, niobium and tantalum), titanium and zirconium. The material containing one or more surface layer-forming elements may be, for example, a metal or compound containing any such element.

The metals containing those elements are elemental metals, such as pure chromium, metallic titanium and metallic zirconium, or alloys, such as ferrochrome, ferrovanadium, ferrotitanium and ferrozirconium. The compounds containing those elements include chlorides, fluorides, oxides and bromides, such as $CrCl_3$, $VCl_3$, $NbCl_3$, $TiCl_3$, $ZrCl_4$, $CrF_6$, $K_2NbF_7$, $NbF_5$, $VF_5$, $K_2TaF_7$, $TiF_4$, $Na_2TiF_6$, $Na_2ZrF_6$, $Cr_2O_3$, $K_2CrO_3$, $V_2O_5$, $NaVO_3$, $Nb_2O_5$, $Ta_2O_5$, $TiO_2$, $ZrO_2$ and $TiBr_4$. One or more of these metals and compounds are employed. It is the most practical choice to use one or more metals, such as pure chromium, metallic titanium and ferrozirconium.

When the iron alloy material is heated with the material or materials containing a surface layer-forming element, a treating agent is also used. It is used to assist the diffusion of the surface layer-forming element into the surface of the iron alloy material. The agent may be composed of at least one compound selected from among the chlorides, fluorides, borofluorides, oxides, bromides, iodides, carbonates, nitrates and borates of alkali or alkaline earth metals, or an ammonium or metal halide or both, or a combination of at least one such alkali or alkaline earth metal compound with an ammonium or metal halide or both. An appropriate agent is selected to suit the method which is employed for the heat treatment of the iron alloy material.

Specific examples of the alkali and alkaline earth metal compounds include NaCl, $CaCl_2$, LiCl, NaF, KF, LiF, $KBF_4$, $Na_2CO_3$, $LiCO_3$, $KCO_3$, $NaNO_3$ and $Na_2O$. One or more of these compounds may be used. The ammonium halide may be selected from among, for example, $NH_4Cl$, $NH_4Br$, $NH_4I$ and $NH_4F$, and the metal halide from among, for example, $CrI_2$, $CrBr_3$, $TiF_4$, $VCl_3$, $FeCl_3$ and $TiBr_4$. If the agent contains one or more of the surface layer-forming elements, the resulting surface layer may also contain the surface layer-forming element or elements which the agent contains. Therefore, the agent which is composed of a halide of any surface layer-forming element, such as $CrCl_3$, $VCl_3$, $NbCl_3$, $TiF_4$ or $ZrCl_4$, may also serve as the material containing the surface layer-forming agent.

The salt bath immersion or electrolysis method and the powder pack method are examples of the method which can be employed for the heat treatment of the iron alloy material. The choice of a particular method depends on whether the treating agent is in a molten or solid state at the temperature at which the heat treatment is carried out. The powder pack method can further be classified into the pack, paste, non-contact and fluidized bed methods.

The salt bath immersion method is a method in which the iron alloy material and the material containing a surface layer-forming element are immersed in a bath composed of the molten treating agent. The treating agent which can be used when this method is employed may be composed of at least one of the chlorides, fluorides, borofluorides, carbonates, nitrates, oxides and borides of the alkali or alkaline earth metals, and/or a metal halide which melts, but does not vaporize, at a temperature below that at which the heat treatment is carried out. The use of two or more of those compounds, e.g. NaCl and $CaCl_2$, is preferred to maintain a satisfactory molten state. An oxide, such as $Al_2O_3$ or $ZrO_2$, or a cyanide, such as NaCN, can be added for adjusting the viscosity of the bath, or for other purposes.

The material containing the surface layer-forming element is immersed in the bath so that the element may be dissolved therein. When the material is immersed, it may be in the form of powder, preferably having a grain size not larger than 200 mesh, or in the form of a thin sheet, so that the surface layer-forming element may be allowed to dissolve. Alternatively, a rod or sheet of the material is immersed in the bath and used as an anode for the anodic dissolution of the element. This way of dissolution enables the element to dissolve quickly and thereby achieves an improved efficiency of work. Moreover, no undissolved material settles at the bottom of the bath. A vessel for the bath or a conductive substance placed therein serves as a cathode. Although a high anode current density brings about a high speed of dissolution, it is sufficient to employ a relatively low current density, insofar as the element can be dissolved even if no electrolysis takes place. A practically appropriate current density ranges from 0.1 to 0.8 $A/cm^2$.

The surface layer-forming element dissolved in the bath is diffused through the surface of the nitride layer on the iron alloy material and forms a nitride or carbonitride layer thereon.

The vessel for the bath may be made of, for example, graphite or steel. A steel vessel is satisfactory for practical purposes.

The salt bath electrolysis method is a method in which the iron alloy material is used as a cathode. It is immersed in a bath composed of the molten treating agent and containing a surface layer-forming element dissolved therein. A vessel for the bath or a conductive substance placed therein is used as an anode.

The treating agent used for the salt bath immersion method can be used for the salt bath electrolysis method, too. The surface layer-forming element can be dissolved in the bath by using the methods as hereinabove described in connection with the salt bath immersion method. Alternatively, it is also possible to dissolve the element by electrolysis using the material containing it as an anode and the iron alloy material as a cathode. This alternative method has the advantage of accomplishing the anodic dissolution of the element and the formation of a surface layer simultaneously.

A cathode current density not exceeding 2 A/cm$^2$ is employed for carrying out the salt bath electrolysis method. A practically appropriate current density ranges from 0.05 to 0.8 A/cm$^2$.

Both of the salt bath immersion and electrolysis methods may be carried out in the open air or in a protective gas, such as nitrogen or argon.

The powder pack method is a method in which the iro alloy material is heated in the presence of a mixed powder composed of the powder of a treating agent and the powder of a material containing a surface layer-forming element. This method has a number of variations. The pack method is a method characterized by packing the iron alloy material in the mixed powder. The paste method employs a paste of the mixed powder covering the surface of the iron alloy material. The non-contact method is characterized by placing the iron alloy material in an appropriately defined space in such a way that it may not contact the mixed powder. According to the fluidized bed method, the iron alloy material is placed in a fluidized bed of the mixed powder.

The treating agent which can be used for any of th variations of the powder pack method is composed of at least one of the chlorides, fluorides, bromides, iodides and borofluorides of alkali or alkaline earth metals, and/or an ammonium or metal halide or both. Referring particularly to the fluidized bed method, the metal halide is a compound which sublimes or vaporizes at a temperature not higher than the temperature which is employed for the heat treatment of the iron alloy material, e.g., $VCl_3$, $FeCl_3$, $TiF_4$, $VF_3$ or $TiBr_4$. If a metal halide which does not sublime or vaporize at such a temperature is used, the treating agent fails to generate a sufficiently large amount of gas to cause the satisfactory diffusion of the surface layer-forming element to form a surface layer having a satisfactory thickness.

The mixed powder preferably contains 0.5 to 20% by weight of the treating agent based on the weight of the material containing the surface layer-forming element. If the proportion of the treating agent deviates from the range hereinabove specified, it is difficult to form continuously a surface layer composed of the nitride or carbonitride of the surface layer-forming element. On the other hand, it becomes easier to form a surface layer continuously, as the proportion approaches the mean value of the range.

The mixed powder may be composed of particles having a particle size less than about 100 mesh when the pack, paste or non-contact method is used. When the fluidized bed method is used, it preferably has a particle size of 60 to 350 mesh. A mixed powder having a particle size which is coarser than 60 mesh requires a large amount of gas for fluidization and makes it difficult to form a surface layer smoothly. A mixed powder having a particle size which is finer than 350 mesh is difficult to handle, as it floats easily. In case the pack, paste or non-contact method is used, the use of coarser or finer particles does not produce any appreciably adverse result.

It is possible to add a certain substance or substances to the mixed powder. For example, it is possible to add an adhesive selected from, for example, dextrins or water glasses, to the mixed powder which is used for the paste method. Some of the treating agents tend to solidify during the heat treatment. It is useful to add the powder of an inert substance such as alumina ($Al_2O_3$), to a mixed powder containing any such treating agent. Some combinations of the material containing a surface layer-forming element and the treating agent may not be so effective for forming a surface layer as the other combinations. The addition of a halide as an activator makes any of such combinations more effective. The amount of any such additive can be determined selectively on a case to case basis.

Referring in further detail to each variation of the powder pack method, the pack method employs a vessel holding the mixed powder. The iron alloy material to be treated is buried in the powder and the vessel is heated in an open or controlled atmosphere heating furnace so that the iron alloy material may be heated. A layer composed of the powder of an inert material, such as alumina, or a metal powder, such as iron-boron powder, can be provided in the open end of the vessel for preventing air from entering it.

The paste method uses a paste which is prepared by adding an adhesive to the mixed powder. The adhesive can be selected from among, for example, an aqueous dextrin solution, glycerin, water glass, ethylene glycol and alcohol. The paste is applied to the surface of the iron alloy material to form thereon a layer having a thickness of usually at least 1 mm. Then, the iron alloy material is usually placed in a vessel and the vessel is heated in a furnace. This heating can be carried out in the open air, but if it is carried out in a non-oxidizing atmosphere, it is possible to employ a paste layer having a smaller thickness. If the paste is applied to only a limited part of the surface of the iron alloy material, it is possible to form a surface layer covering only that part of the surface.

According to the non-contact method, the iron alloy material and the mixed powder are placed in a closed space. The mixed powder is placed adjacent to the open end of the vessel to prevent air from entering it. The iron alloy material is so positioned in the vessel that it may not contact with the mixed powder, and the vessel is heated. The absence of contact between the iron alloy material and the mixed powder provides certain operational advantages.

According to the fluidized bed method, the iron alloy material and the mixed powder are placed in a fluidized bed furnace. The mixed powder contains a refractory material, such as alumina, which prevents it from forming a solid mass during its fluidization. A fluidizing gas is introduced into the furnace to form a fluidized bed of the powder and the furnace is heated. This method makes it possible to form a very smooth surface layer having a uniform thickness, as the fluidized bed has a uniform temperature distribution. The fluidizing gas may be an inert gas, such as argon, or a non-oxidizing gas, such as nitrogen. The gas is supplied at a rate of preferably at least 50 cm per minute as measured in the fluidized bed, so that no powder may adhere to the surface layer on the iron alloy material. It is advisable from the standpoint of easy operation to employ a gas pressure of 0.5 to 2 kg/cm$^2$.

The iron alloy material is heated at a temperature not exceeding 700° C. The use of any temperature exceeding 700° C. produces strain in the iron alloy material. The heating temperature is preferably not higher than 580° C. if the surface layer-forming element is one of Group Va metals. The lower limit of the heating temperature is preferably 450° C. The use of a lower temperature results in the very slow formation of a surface layer. Therefore, it is generally advisable to employ a temperature range of 500° C. to 650° C. which coincides with the range of temperatures used for the high temperature tempering of die steel or for the tempering of strutural steel. If any of Group Va elements is used, it is practically appropriate to employ a temperature of 500° C. to 580° C.

The iron alloy material is heated for a period of time which usually ranges from one to 50 hours, depending on the amount of the surface layer-forming element which the resulting surface layer should contain. If it is heated for a long time, the surface layer contains a large amount of the surface layer-forming element.

It is practically appropriate to form a surface layer having a thickness of, say, 3 to 15 microns.

According to this invention, a surface layer composed of the nitride or carbonitride of a surface layer-forming element is formed on the iron alloy material. While the mechanism of its formation is not clear, the following is a description of the mechanism which the inventors of this invention assume from the results of analysis by a microanalyzer and the relation which they have found between the length of heating time and the thickness of the surface layer. The following description refers to the formation of a surface layer composed of carbonitride. In the following description, the suffixed letters "m", "n", "o" and "p" stand for numerals.

If the iron alloy material to be treated is nitrided, the nitrogen (N) supplied from an external source reacts with the iron (Fe) and carbon (C) in the surface portion of the iron alloy material to form a layer of nitride which is expressed as Fe$_m$(C,N)$_n$. A solid solution of nitrogen, which is expressed as Fe-N, is also formed immediately under the nitride layer.

Then, if the iron alloy material is heated with a material containing a surface layer-forming element (hereinafter expressed "M") and the treating agent, the element M is diffused into the nitride layer. This diffusion is a reaction which causes the substitution of M for Fe in Fe$_m$(C,N)$_n$ and thereby the formation of a layer of nitride expressed as (M,Fe)$_o$(C,N)$_p$. If the nitride Fe$_m$(C,N)$_n$ is completely converted to (M,Fe)$_o$(C,N)$_p$, there is no further growth of the (M,Fe)$_o$(C,N)$_p$ layer. The (M,Fe)$_o$(C,N)$_p$ layer contains a larger amount of M and a smaller amount of Fe toward its surface than toward the base material. Therefore, it is sometimes true that it contains only a very small amount of Fe on or adjacent to its surface and had better be expressed as a layer of M$_o$(C,N)$_p$.

Thus, the thickness of the surface layer which is formed on the iron alloy material is equal to that of the nitride layer formed thereon by the preceding nitriding treatment. Therefore, the conditions of the nitriding treatment dictate the maximum thickness of the surface layer. The surface layer existing on the iron alloy material until the nitride Fe$_m$(C,N)$_n$ is completely converted to (M,Fe)$_o$(C,N)$_p$, is composed of a layer of (M,Fe)$_o$(C,N)$_p$ growing adjacent to its surface and a layer of Fe$_m$(C,N)$_n$ remaining adjacent to the base material. The thickness of this surface layer is substantially equal to that of the initial Fe$_m$(C,N)$_n$ layer.

It is assumed that the foregoing description is also applicable to the formation of a surface layer composed of the nitride of a surface layer-forming element.

The mechanism as hereinabove described is possible, since the method of this invention employs a low heating temperature not exceeding 700° C. There is not known any method of forming a surface layer in accordance with any such mechanism and any such relationship between heating time and layer thickness. Referring, for instance, to EXAMPLE 1, the heating time did not have any effect on the thickness of the surface layer, i.e. the total thickness of the Fe$_m$(C,N)$_n$ layer and the (M,Fe)$_o$(C,N)$_p$ layer, when a heating temperature of 550° C. was employed, as shown by a curve Al. On the other hand, when a temperature of 1000° C. was employed, the thickness of the surface layer increased with an increase in heating time, as shown by a curve SL. This is exactly what results from ordinary diffusion treatment.

In practice, the initial nitride layer need not be completely converted to (M,Fe)$_o$(C,N)$_p$, but two layers can exist together. This is true when the initial nitride layer is composed solely of iron and nitrogen, too.

According to this invention, a surface layer-forming element is diffused at a temperature not exceeding 700° C. in the presence of a particular treating agent into the surface of an iron alloy material on which a layer of nitride composed of iron and nitrogen, or iron, carbon and nitrogen has been formed. It is possible to form an excellent surface layer composed of the nitride or carbonitride of the surface layer-forming element on the iron alloy material even at a low temperature.

The use of a low temperature substantially completely prevents the growth of strain in the iron alloy material. The use of a low temperature ensures the ease of operation and does not require a large amount of energy.

According to this invention, the surface layer is formed by diffusion. Despite the use of a low temperature, therefore, the layer is dense and adheres firmly to the base material, as opposed to a carbide or nitride layer formed by PVD without relying on any diffusion reaction. Moreover, the layer has a practically satisfactory thickness.

The method of this invention requires only a very short time for forming a surface layer, as compared with any known method of forming a surface layer of carbide without employing any preliminary nitriding treatment.

The invention will now be described more specifically with reference to a variety of examples. In the following examples, % is shown by weight unless otherwise noted.

EXAMPLE 1

A specimen in the form of a round bar of high speed tool steel (AISI M2) having a diameter of 6 mm and a length of 30 mm was nitrided by immersion in a salt bath having a temperature of 570° C. for two hours. A vessel made of heat-resistant steel and holding a mixture composed of 52 mol% of CaCl$_2$ and 48 mol % of NaCl was heated in an electric furnace in the air to form a molten salt bath having a temperature of 550° C. A powder of pure chromium having a particle size under 100 mesh was added to the bath. The amount of the powder added was 20% of the weight of the bath. The specimen was immersed in the salt bath having a temperature of 550° C. After a period of one to 25 hours had passed, it was taken out and quenched in oil. After the bath material adhering to the specimen had been washed away, an end surface thereof was ground to prepare a sectional surface for the examination of a surface layer formed on the specimen and the thickness of the layer was measured. The results are shown by a curve AL in FIG. 1. The thickness of the layer which is shown by the curve AL at the immersing time of 0 hour is that of the initially formed nitride layer. The thickness shown thereafter is the thickness of the whole surface layer, i.e., the total thickness of the remaining nitride layer and the growing layer of chromium carbonitride. The thickness of the carbonitride layer per se is shown by a curve BL. The thickness of the whole surface layer did not show any appreciable change with the lapse of the immersing time, but was always about four microns.

Figure 3:
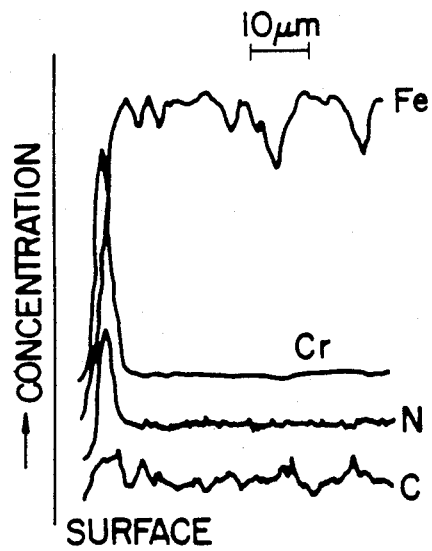
FIGS. 3, 5, 7 to 12, 15, 17, 18, 20 to 24, 27, 29, 31, 34, 36 and 39 are graphs showing the results of analysis by an X-ray microanalyzer of the surface portions of the iron alloy materials as treated in EXAMPLES 1 to 4, 7, 8, 10, 11, 13, 14, 16, 19 to 21, 23, 24, 26, 27, 35, 38, 39 and 47, respectively.
Figure 2:
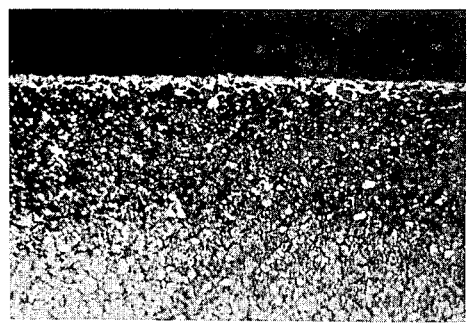
FIGS. 2, 4, 6, 14, 16, 19, 26, 28, 30, 33, 35, 37 and 38 are photomicrographs of 400 magnifications showing the structure in profile of the surface layers formed in EXAMPLES 1 to 3, 13, 14, 18, 26, 27, 31, 38, 39, 43 and 44, respectively.

FIG. 2 is a photomicrograph of 400 magnifications showing in profile the surface layer which was formed after nine hours of immersion treatment. It was a layer having a smooth surface. The layer and the base material had therebetween a boundary having a complicated contour defining an intimate bond therebetween. The layer was analyzed by an X-ray microanalyzer. The results are shown in FIG. 3. The analysis revealed the presence of N and C, as well as Cr, in the layer. The layer was found to contain about 60% of chromium. The examination of the layer by X-ray diffraction gave diffraction patterns indicating the presence of $Cr_2N$ and $CrN$. Therefore, it was concluded that the layer was a combined layer of chromium carbonitrides expressed as $(Cr,Fe)_2(N,C)$ and $(Cr,Fe)(N,C)$.

For the sake of comparison, an equally sized and nitrided sample of AISI M2 steel was treated by immersion in a salt bath of the same composition heated to a temperature of 1000° C., whereby a layer of chromium carbonitride was formed on the sample. The thickness of this layer showed an increase with the immersing time, as shown by a curve SL in FIG. 1. As the layer formed in accordance with this invention did not show any appreciable change in thickness with the immersing time, it is clear that the mechanism of its formation differed from that through which the layer was formed on the comparative sample.

EXAMPLE 2

The procedure of EXAMPLE 1 was repeated for nitriding a round bar of AISI 1045 structural steel having a diameter of 7 mm and a length of 50 mm and preparing a molten salt bath composed of a mixture of $CaCl_2$ and $NaCl$. A powder of $CrCl_3$ having a particle size under 320 mesh was added to the bath. The amount of the powder added was 15% of the weight of the bath. The bath was heated to a temperature of 500° C. and the specimen was immersed therein. After a period of one to 16 hours had passed, the specimen was taken out and quenched in oil.

Figure 5:
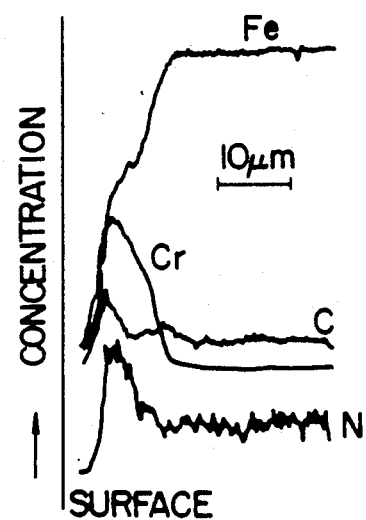
Figure 4:
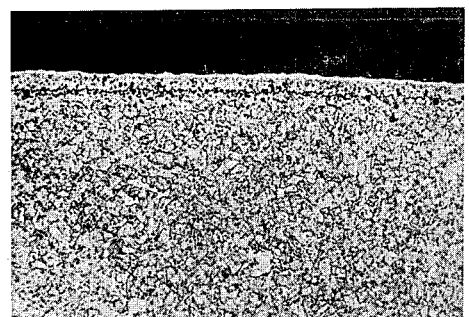

A plurality of specimens were treated for different periods of time, as hereinabove described. All of the surface layers formed on the specimens were found to be of almost the same thickness and structure irrespective of the length of immersing time. FIG. 4 is a photomicrograph of 400 magnifications showing in profile the surface layer formed by four hours of treatment. It had a thickness of about eight microns. The examination of the layer by X-ray diffraction and the analysis thereof by an X-ray microanalyzer indicated that it was a combined layer of chromium carbonitrides $(Cr,Fe)_2(N,C)$ and $(Cr,Fe)(N,C)$. The results of the analysis by an X-ray microanalyzer are shown in FIG. 5.

EXAMPLE 3

A cylindrical specimen of AISI 1048 structural steel having an outside diameter of 10 mm, an inside diameter of 6 mm and a length of 25 mm was given six hours of gas soft-nitriding treatment at a temperature of 570° C. The procedure of EXAMPLE 1 was repeated for preparing a molten salt bath composed of $CaCl_2$ and $NaCl$. A powder of $Al_2O_3$ having a particle size under 320 mesh and a powder of ferrochrome having a particle size under 200 mesh were added to the bath. The amounts of $Al_2O_3$ and ferrochrome added were 3% and 20%, respectively, of the weight of the bath. The bath was heated to 550° C. and the specimen was immersed therein. After a certain period of time had passed, it was taken out and quenched in oil.

Four specimens, which had been prepared as hereinabove described, were treated for one, nine, 25 and 50 hours, respectively. Then, they were examined for roundness. All of them showed substantially the same roundness with a deviation of only about five microns at both the upper and lower ends thereof.

For the sake of comparison, another specimen was immersed in the bath having a temperature of 850° C. and treated for four hours. It showed a roundness deviation of about 20 microns which was about four times worse than the roundness of any of the specimens treated in accordance with this invention.

Figure 6:
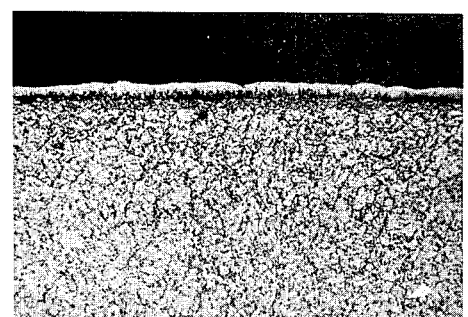
Figure 7:
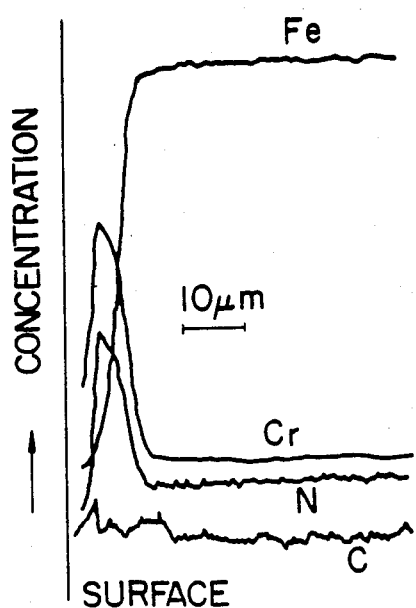

One of the specimens treated in accordance with this invention, which had been treated at 550° C. for 50 hours, was cut in profile for structure examination. FIG. 6 is a photomicrograph of 400 magnifications showing in profile the surface layer formed on that specimen. It was also analyzed by an X-ray microanalyzer. The results are shown in FIG. 7. It was a combined layer of chromium carbonitrides $(Cr,Fe)_2(N.C)$ and $(Cr,Fe)(N,C)$ having a thickness of about eight microns.

EXAMPLE 4

A specimen in the form of a round bar of AISI M2 high speed tool steel having a diameter of 6 mm and a length of 30 mm was ionically nitrided at 550° C. for three hours. A molten salt bath was prepared in a graphite vessel. Its composition was equal to that of the bath used in EXAMPLE 1. A plate of pure chromium having a length of 40 mm, a width of 35 mm and a thickness of 4 mm was placed in the center of the bath. It was used as an anode, and the graphite vessel as a cathode. An electric current was supplied for about 15 hours so that the anode might have a current density of 0.8 $A/cm^2$. The decrease in weight of the chromium plate which had resulted from the anodic dissolution was measured to calculate the amount of chromium dissolved in the bath. It was about 7% of the weight of the bath. The specimen was immersed in the bath at 550° C. for nine hours, taken out and quenched in oil.

Figure 8:
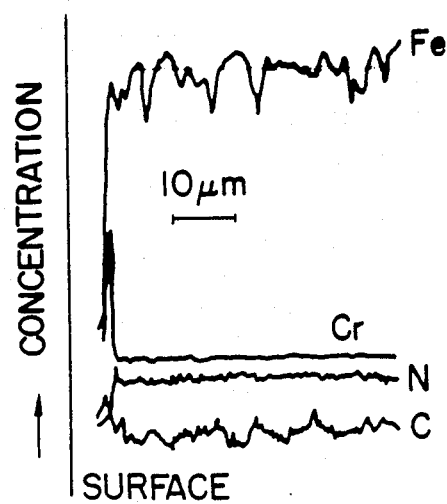

Then, the specimen was cut in profile for examination by an X-ray microanalyzer. The surface layer which had been formed on the specimen was found to contain carbon, in addition to chromium and nitrogen, as shown in FIG. 8. The examination of the surface layer by X-ray diffraction gave diffraction patterns coinciding closely with those of CrN and Cr$_2$N. Thus, it was concluded as a chromium carbonitride layer.

EXAMPLE 5

A specimen in the form of a round bar of AISI 1045 structural steel having a diameter of about 7 mm and a length of 50 mm was nitrided in a salt bath at 570° C. for an hour. A graphite vessel holding a mixture composed of 50 mol % of KF and 50 mol % of LiF was heated to 600° C. in an electric furnace in the air to prepare a molten salt bath. A powder of pure chromium having a particle size under 100 mesh was added to the bath. The amount of the powder added was 25% of the weight of the bath. The specimen was immersed in the bath having a temperature of 600° C. It was used as a cathode, and the graphite vessel as an anode. An electric current was supplied for eight hours so that the cathode might have a current density of 0.1 A/cm$^2$.

Then, the specimen was taken out and quenched in oil. The surface layer which had been formed by electrolysis was examined by an X-ray microanalyzer. The results of the examination showed that it was a layer composed of (Cr,Fe)$_2$(C,N) and (Cr,Fe)(C,N). The analysis of the layer from its surface showed that it contained nitrogen and carbon, as well as about 60% of chromium.

EXAMPLE 6

The procedure of EXAMPLE 1 was repeated for nitriding a specimen of AISI M2 steel. A vessel made of heat-resistant steel and holding a mixture of 45% of Li$_2$CO$_3$, 25% of K$_2$CO$_3$ and 30% of Na$_2$CO$_3$ was heated to 550° C. in an air atmosphere furnace to prepare a molten salt bath. A powder of pure chromium having a particle size under 100 mesh mesh was added to the bath. The amount of the powder added was 30% of the weight of the bath. After the bath had been fully stirred, the specimen was immersed therein and held at a temperature of 550° C. for four hours, whereby a surface layer was formed on the specimen.

After the specimen had been taken out and quenched in oil, the surface layer was examined by an X-ray microanalyzer. It was a layer composed of (Cr,Fe)$_2$(C,N) and (Cr,Fe)(C,N).

EXAMPLE 7

A specimen of AISI 1045 steel having a diameter of 8 mm and a length of 30 mm was given 150 minutes of gas soft-nitriding treatment at 570° C. Then, it was packed in a mixed powder in a stainless steel vessel. The powder was composed of 90% of pure chromium and 10% of potassium borofluoride (KBF$_4$) and had a particle size under 100 mesh A powder of ferroboron having a particle size under 100 mesh was placed on the mixed powder to form an antioxidizing layer having a thickness of 3 to 4 mm. The vessel was heated at 600° C. for 16 hours in an atmospheric furnace. After the vessel had been taken out of the furnace, it was allowed to cool in the air and the specimen was removed from the powder.

Figure 9:
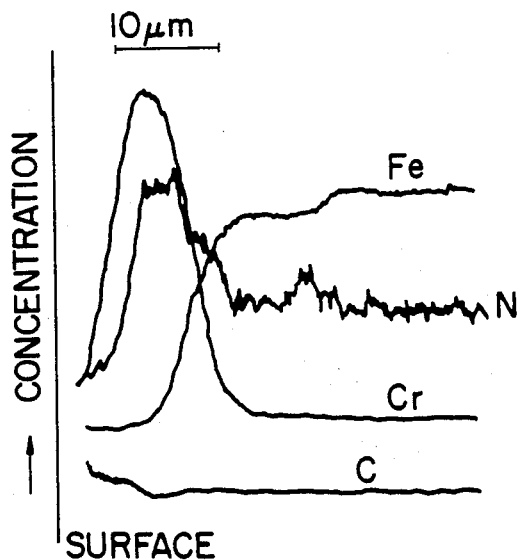

The surface layer which had been formed on the specimen was examined by an X-ray microanalyzer. It was a layer composed of chromium, nitrogen and carbon, as shown in FIG. 9. The analysis of the layer from its surface indicated the presence of about 60% of chromium. Thus, it was a chromium carbonitride layer.

EXAMPLE 8

Figure 10:
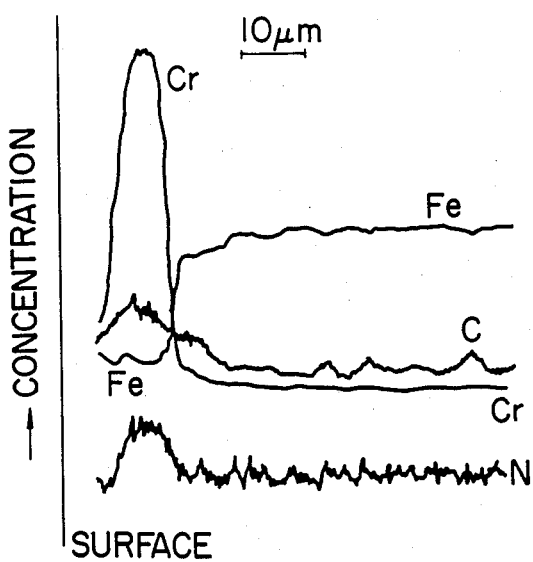

A specimen of AISI W1 carbon tool steel having a diameter of 7 mm and a length of 30 mm was given 60 hours of gas nitriding treatment at 570° C. Then, it was heated at 650° C. for 16 hours in a mixed powder which was equal to that which had been used in EXAMPLE 7, whereby a surface layer was formed on the specimen. It was examined by an X-ray microanalyzer. It was a layer composed of chromium, nitrogen and carbon, as shown in FIG. 10. The analysis of the layer from its surface showed the presence of about 50% of chromium. Thus, it was a chromium carbonitride layer.

EXAMPLE 9

A paste was prepared from a mixed powder composed of 40% of alumina (Al$_2$O$_3$) having a particle size under 200 mesh mesh, 55% of ferrochrome having a particle size under 100 mesh and 5% of ammonium chloride (NH$_4$Cl) having a particle size of 80 to 100 mesh by using a solvent which had been prepared by dissolving ethyl cellulose in ethyl alcohol. The conditions of EXAMPLE 8 were repeated for gas nitriding a specimen of AISI W1 carbon tool steel having a diameter of 20 mm and a length of 10 mm. The paste was applied to the surface of the specimen to form a layer having a thickness of 3 to 5 mm thereon. Then, the specimen was placed in a stainless steel vessel and heated at 600° C. for 16 hours in an argon gas atmosphere, whereby a surface layer was formed thereon.

The examination of the surface layer by an X-ray microanalyzer showed that it was a chromium carbonitride layer.

EXAMPLE 10

A mixed powder composed of 60% of Al$_2$O$_3$ having a particle size under 80 mesh, 38.8% of pure chromium having a particle size under 100 mesh and 1.2% of NH$_4$Cl having a particle size under 80 mesh was placed in a fluidized bed furnace. Argon gas was introduced into the furnace through its bottom to fluidize the powder. The argon gas had a pressure of 1.5 kg/cm$^2$ at the inlet of the furnace and a flow rate of 200 cm/min. in the furnace. A round bar of AISI W1 carbon tool steel having a diameter of 7 mm and a length of 50 mm, which had been nitrided in a salt bath under the conditions employed in EXAMPLE 1, was placed in the furnace and heated at 600° C. for 16 hours, whereby a surface layer was formed on the bar.

Figure 11:
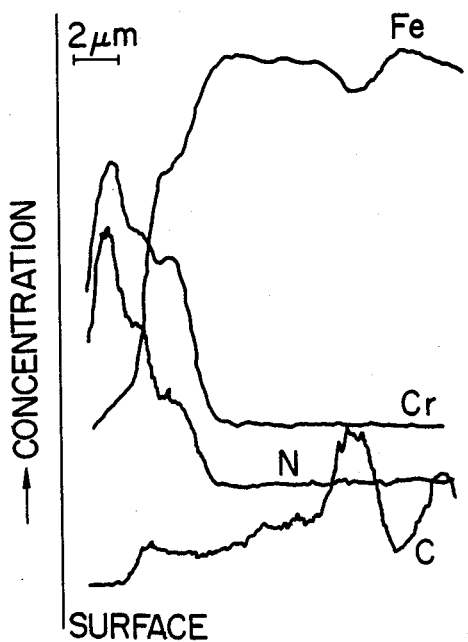

The examination of the surface layer by an X-ray microanalyzer showed that it was composed of chromium, nitrogen and carbon, as shown in FIG. 11. The analysis of the layer from its surface showed the presence of about 40% of chromium. The examination of the layer by X-ray diffraction gave a diffraction pattern coinciding closely with that of CrN. Thus, it was a layer of (Cr,Fe)(C,N).

EXAMPLE 11

A specimen of AISI H13 hot working die tool steel having a diameter of 7 mm and a length of 50 mm was nitrided in a salt bath at 570° C. for four hours. A mixed powder composed of 58.8% of Al$_2$O$_3$ having a particle size under 80 mesh, 40% of pure chromium having a particle size under 100 mesh and 1.2% of NH$_4$Cl having a particle size under 80 mesh was placed in a fluidized bed furnace. Argon gas was introduced into the furnace through its bottom at a pressure of 1.5 kg/cm$^2$ and a flow rate of 200 cm/min. to fluidize the powder. The specimen was placed in the furnace and heated at 600° C. for 16 hours, whereby a surface layer was formed thereon.

Figure 12:
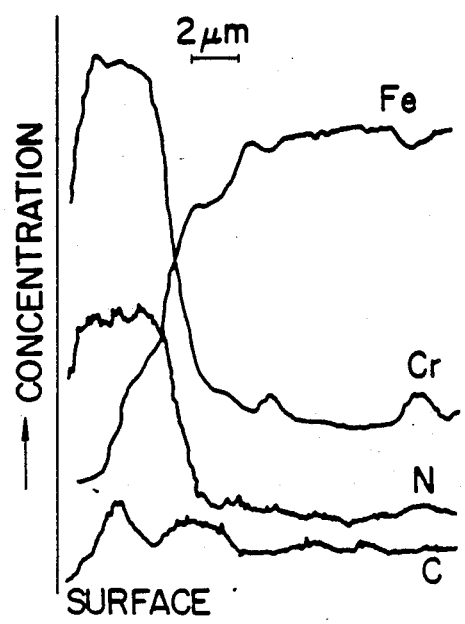

The examination of the surface layer by an X-ray microanalyzer indicated that it was composed of chromium, nitrogen and carbon, as shown in FIG. 12. The analysis of the layer from its surface showed the presence of about 60% of chromium. The examination of the layer by X-ray diffraction gave a diffraction pattern coinciding closely with that of CrN. Thus, it was a layer of (Cr,Fe)(C,N).

EXAMPLE 12

A specimen of AISI 1045 steel having a diameter of 6.5 mm and a length of 40 mm was nitrided in a salt bath under the conditions employed in EXAMPLE 1. A mixture composed of 52 mol % of $CaCl_2$ and 48 mol % of NaCl was placed in a vessel made of heat-resistant steel and heated to 600° C. in an atmospheric electric furnace to prepare a molten salt bath. A powder of pure chromium having a particle size under 200 mesh was added to the bath. The amount of the powder added was 25% of the weight of the bath. The specimen was immersed in the bath having a temperature of 600° C. and after eight hours had passed, it was taken out and quenched in oil, whereby a surface layer was formed thereon. The examination of the layer by X-ray diffraction gave diffraction patterns corresponding to those of $(Cr,Fe)_2(C,N)$ and $(Cr,Fe)(C,N)$. Thus, it was a chromium carbonitride layer.

Then, a dry friction test was conducted on the specimen (Specimen No. C1) by using a Falex lubricant testing machine. The test was conducted at a load of 200 kg, a rotating speed of 300 rpm and a friction rate of 0.1 m/sec. by using a testing member formed from gas carburized SCM415 [JIS(Japanese Industrial Standards)] steel chromium molybdenum steel) containing 0.12 to 0.18 of C, 0.85 to 1.25 of Cu and 0.15 to 0.35 of Mo.

For the sake of comparison, a friction test was conducted on a specimen of AISI 1045 steel which had not been nitrided or treated as hereinabove described (Specimen No. S2), and a specimen of AISI 1045 steel which had been nitrided, but had not been treated (Specimen No. S3).

Specimen No. S2 seized and showed a wear of about 90 mg/cm² when the test was conducted for a period of only about three seconds. Specimen No. S3 showed a wear of about 35 mg/cm² when the test was conducted for three minutes, though it did not seize. On the other hand, Specimen No. C1 according to this invention did not show any appreciable wear or any trace of seizing when the test was conducted for three minutes.

The same friction test was conducted also on a specimen of AISI 1045 steel having an approximately three-micron thick layer of vanadium carbide (VC) formed by three hours of immersion in a salt bath at a temperature of 900° C. and a specimen of AISI 1045 steel having an approximately seven-micron thick layer of titanium carbonitride Ti(C,N) formed by four hours of chemical vapor deposition at 850° C. There was no appreciable difference in wear between these specimens and Specimen No. C1 which had been treated in accordance with this invention. Therefore, it is evident that the surface layer which is formed by the method of this invention is comparable in wear and seizing resistance to the surface layer formed by the high temperature salt bath immersion or CVD method.

EXAMPLE 13

Figure 13:
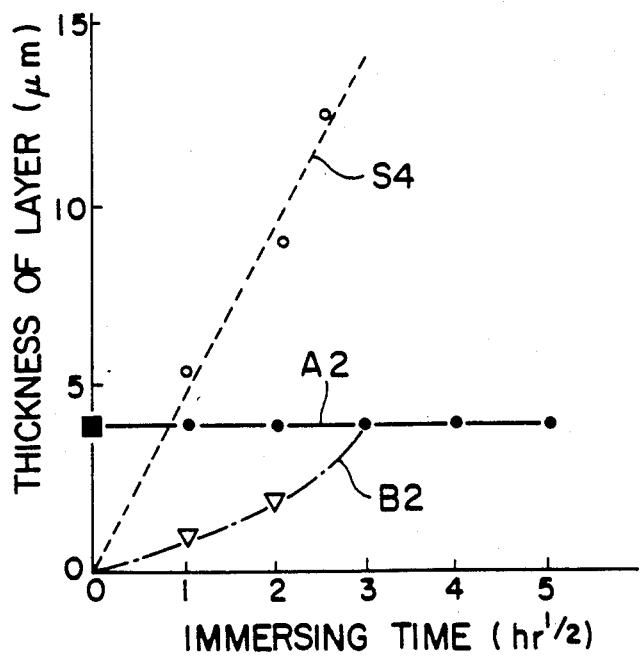

A plurality of specimens each in the form of a round bar of AISI M2 steel having a diameter of 6 mm and a length of 30 mm were nitrided by two hours of immersion in a salt bath having a temperature of 570° C. A vessel made of heat-resistant steel and holding a mixture composed of 52 mol % of $CaCl_2$ and 48 mol % of NaCl was heated in an atmospheric electric furnace to form a salt bath having a temperature of 550° C. A powder of ferrovanadium having a particle size under 100 mesh (Fe-V containing 85% of vanadium) was added to the bath. The amount of the powder added was 20% of the weight of the bath. Each of the nitrided specimens was immersed in the bath and after a period of one to 25 hours had passed, it was taken out and quenched in oil. After the bath material adhering to each specimen had been washed away, it was ground to prepare a cross-sectional surface for structure examination and the thickness of the surface layer which had been formed on the specimen was measured. The results are shown by a curve A2 in FIG. 13. The thickness which is shown by curve A2 at the immersing time of 0 hour is that of the initially formed nitride layer. Each thickness that curve A2 shows thereafter, beginning at the immersing time of one hour, is the thickness of the whole surface layer, i.e., the total thickness of the remaining nitride layer and the growing vanadium carbonitride layer. The thickness of the carbonitride layer per se is shown by curve B2. The thickness of the whole surface layer did not show any appreciable change irrespective of the immersing time, but was about four microns.

Figure 14:
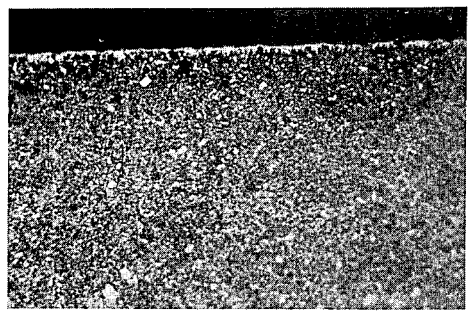
Figure 15:
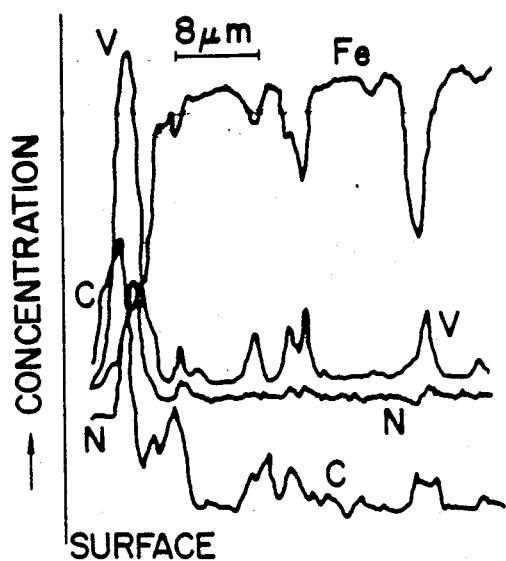

FIG. 14 is a photomicrograph of 400 magnifications showing in profile the surface layer formed by eight hours of immersion treatment. It was a layer having a smooth surface. The layer and the base material had therebetween a boundary having a complicated contour forming an intimate bond therebetween. The examination of the layer by an X-ray microanalyzer indicated that it contained nitrogen and carbon in addition to vanadium, as shown in FIG. 15. The analysis of the layer from its surface showed that it contained about 45% of vanadium. The examination of the layer by X-ray diffraction gave a diffraction pattern corresponding to that of VN. Thus, it was a layer of vanadium carbonitride (V,Fe)(N,C).

For the sake of comparison, a plurality of specimens of AISI M2 steel were nitrided under the same conditions and treated by immersion in a salt bath of the same composition heated to 1000° C. The surface layers of vanadium carbonitride formed on these specimens showed an increase in thickness with an increase in immersing time, as shown by curve S4 in FIG. 13. As such was not the case with the thickness of any of the layers formed in accordance with this invention, it is evident that the mechanism of its formation differed from the mechanism through which the layers were formed on the comparative specimens which had been treated at a higher temperature.

EXAMPLE 14

The procedures of EXAMPLE 13 were repeated for nitriding specimens of AISI 1045 steel having a diameter of 7 mm and a length of 50 mm and preparing a salt bath from $CaCl_2$ and NaCl. A powder of $VCl_3$ having a particle size under 320 mesh was added to the bath. The amount of the powder added was 15% of the weight of the bath. The bath was heated to 500° C. and each specimen was immersed therein. After a period of one to 16 hours had passed, the specimens were taken out and quenched in oil.

Figure 16:
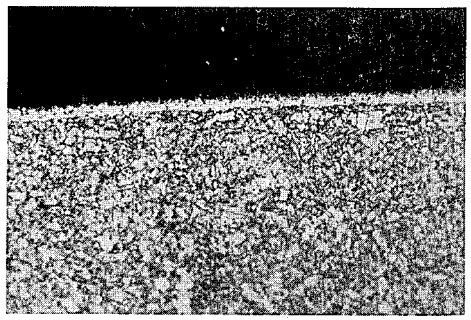
Figure 17:
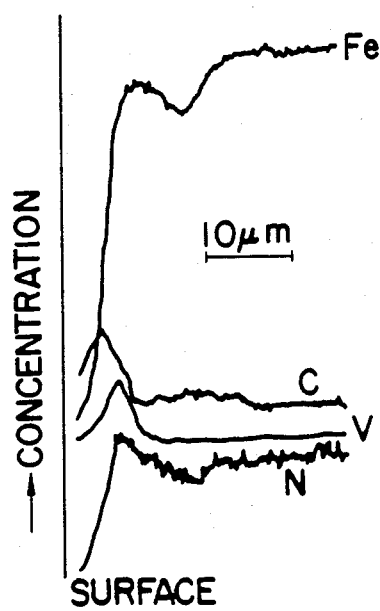

The surface layers which had been formed on the specimens were all of virtually the same thickness and structure. Referring by way of example to the specimen which was treated for four hours, FIG. 16 is a photomicrograph of 400 magnifications showing a profile of the layer which was formed on its surface. It had a thickness of about eight microns. The examination of the layer by X-ray diffraction and by an X-ray microanalyzer showed that it was a layer of vanadium carbonitride (V,Fe)(N,C). The results of the examination by an X-ray microanalyzer are shown in FIG. 17.

EXAMPLE 15

Two specimens each in the form of a cylinder having an outside diameter of 10 mm, an inside diameter of 6 mm and a length of 25 mm and made of AISI 1048 structural steel were given six hours of gas soft-nitriding treatment at 570° C. A salt bath of the same composition as that used in EXAMPLE 13 was prepared from $CaCl_2$ and NaCl. A powder of $Al_2O_3$ having a particle size under 320 mesh and a powder of ferrovanadium containing 85% of vanadium) having a particle size under 200 mesh were added to the bath. The amounts of the alumina and ferrovanadium added were 3% and 20%, respectively, of the weight of the bath. The bath was heated to 550° C. and the specimens were immersed therein. When nine hours had passed, one of the specimens was taken out and quenched in oil and when 25 hours had passed, the other specimen was taken out and quenched in oil.

The specimens were examined for roundness. They were substantially of the same roundness and showed a deviation of only about five microns from a true circle at both the upper and lower ends thereof. For the sake of comparison, a specimen which had been treated in a salt bath having a temperature of 850° C. for four hours showed a deviation of about 20 microns which was about four times greater than that of any of the specimens which had been treated in accordance with this invention.

One of the specimens which had been treated at 550° C. for nine hours in accordance with this invention was cut in profile to prepare a section for the examination of the surface layer which had been formed thereon. The surface layer had a thickness of about eight microns. The examination of the layer by an X-ray microanalyzer showed that it was a layer of vanadium carbonitride (V,Fe)(N,C).

EXAMPLE 16

A specimen of AISI D2 cold working die tool steel having a diameter of 6 mm and a length of 30 mm was ionically nitrided at 550° C. for three hours. A salt bath of the same composition as that used in EXAMPLE 13 was prepared from $CaCl_2$ and NaCl in a graphite vessel. A sheet of Fe-V containing 85% of vanadium having a length of 40 mm, a width of 35 mm and a thickness of 4 mm was placed in the center of the bath. This sheet was used as an anode, and the graphite vessel as a cathode. An electric current was supplied for about 15 hours so that the anode might have a current density of 0.6 $A/cm^2$. The decrease in weight of the Fe-V sheet showed that its anodic dissolution had resulted in the bath containing about 6% of vanadium. The specimen was immersed in the bath at 550° C. and when nine hours had passed, it was taken out and quenched in oil.

Figure 18:
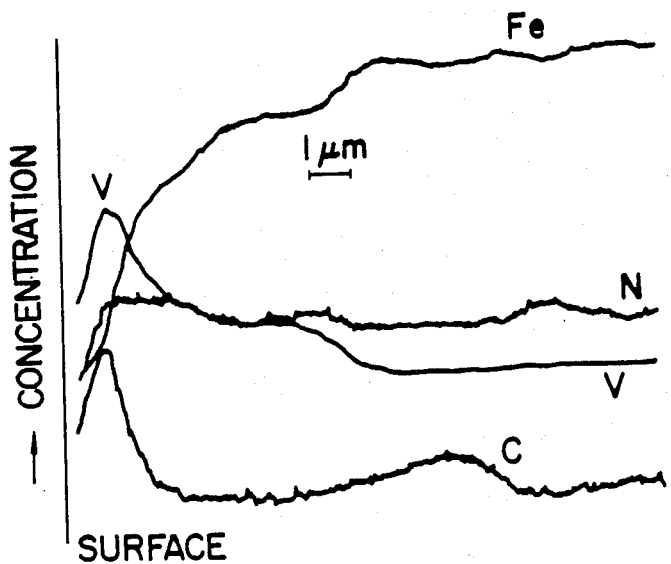

Then, the specimen was cut in profile for examination by an X-ray microanalyzer. The surface layer which had been formed thereon was found to contain carbon in addition to vanadium and nitrogen, as shown in FIG. 18. The examination of the layer by X-ray diffraction gave a diffraction pattern coinciding closely with that of VN. Thus, it was a layer of vanadium carbonitride.

EXAMPLE 17

A specimen of AISI 1045 steel having a diameter of about 7 mm and a length of 50 mm was nitrided in a salt bath at 570° C. for an hour. A graphite vessel holding a mixture composed of 50 mol % of KF and 50 mol % of LiF was heated to 580° C. in an atmospheric electric furnace to prepare a molten salt bath. A powder of Fe-V containing 85% of vanadium having a particle size under 100 mesh was added to the bath. The amount of the powder added was 25% of the weight of the bath. The specimen was immersed in the bath. An electric current was supplied to carry out electrolysis at a cathode current density of 0.05 $A/cm^2$ for eight hours using the specimen as a cathode and the graphite vessel as an anode.

Then, the specimen was taken out and quenched in oil. The surface layer which had been formed thereon was examined by an X-ray microanalyzer. It was a layer composed of (V,Fe)(C,N). The examination of the layer from its surface showed that it contained nitrogen and carbon in addition to about 45% of vanadium.

EXAMPLE 18

A specimen of industrial pure iron having a diameter of 8 mm and a length of 35 mm was ionically nitrided under the conditions employed in EXAMPLE 16. The pure ron was of the type not containing more than 0.03% of carbon. A salt bath of the same composition as that used in EXAMPLE 13 was prepared from $CaCl_2$ and NaCl in a steel vessel. A powder of Fe-V containing 85% of vanadium having a particle size of 200 mesh was added to the bath. The amount of the powder added was 30% of the weight of the bath. The bath was heated to 580° C. and the specimen was immersed therein. When eight hours had passed, it was taken out and quenched in oil.

Figure 19:
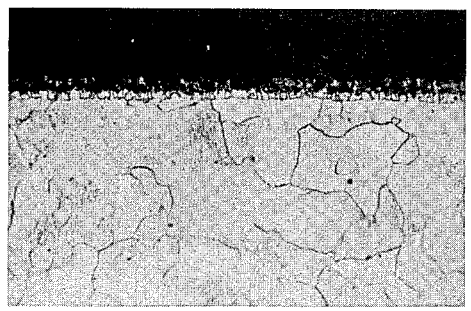

FIG. 19 is a photomicrograph of 400 magnifications showing in profile the surface layer which was formed on the specimen. It had a thickness of about 12 microns which was substantially equal to the thickness of the ionically nitrided layer. The examination of the layer by an X-ray microanalyzer showed that it contained nitrogen and carbon in addition to about 70% of vanadium.

The examination of the layer by X-ray diffraction gave diffraction patterns indicating the presence of $V_2N$ and VN. Thus, it was a layer composed of vanadium carbonitrides $(V,Fe)_2(C,N)$ and (V,Fe)(C,N).

EXAMPLE 19

The procedure of EXAMPLE 13 was repeated for nitriding a specimen of AISI 1045 steel in a salt bath. A vessel made of heat-resistant steel and holding a mixture composed of 45% of $Li_2CO_3$, 25% of $K_2CO_3$ and 30% of $Na_2CO_3$ was heated to 550° C. in an atmospheric electric furnace to prepare a molten salt bath. A powder of pure niobium having a particle size of 100 mesh was added to the bath. The amount of the powder added was 30% of the weight of the bath. After the bath had been fully stirred, the specimen was immersed therein and held at 550° C. for four hours, whereby a surface layer was formed on the specimen. Then, it was taken out and quenched in oil.

Figure 20:
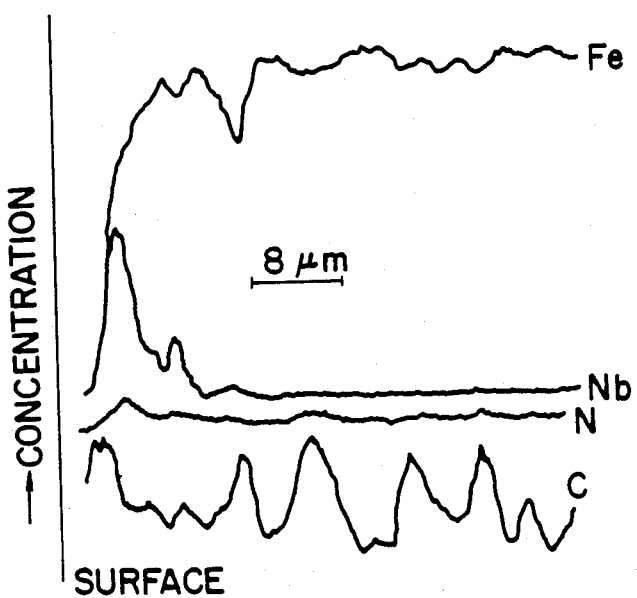

The surface layer was examined by an X-ray microanalyzer. It was found to contain nitrogen and carbon in addition to niobium, as shown in FIG. 20. The examination of the layer by X-ray diffraction gave a diffraction pattern coinciding closely with that of NbN. Thus, it was a layer composed of (Nb,Fe)(C,N).

EXAMPLE 20

A specimen of AISI W1 steel having a diameter of 8 mm and a length of 30 mm was given 150 minutes of gas soft-nitriding treatment at 570° C. It was placed in a stainless steel vessel holding a mixed powder composed of 90% of Fe-V containing 85% of vanadium and 10% of potassium borofluoride ($KBF_4$) and having a particle size under 100 mesh, so that it might be buried in the powder. A powder of ferroboron having a particle size under 100 mesh was placed on the mixed powder to form an antioxidizing layer having a thickness of 3 to 4 mm. The vessel was heated at 580° C. for 16 hours in an atmospheric furnace. The vessel was taken out of the furnace and after it had been cooled by air, the specimen was removed from the powder.

Figure 21:
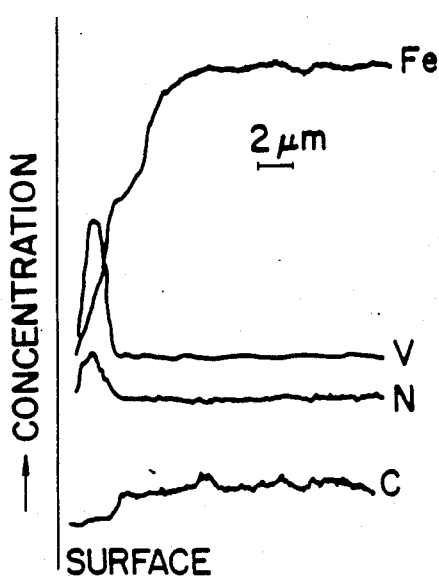

The surface layer which had been formed on the specimen was examined by an X-ray microanalyzer. It was found to contain vanadium, nitrogen and carbon, as shown in FIG. 21. The examination of the layer from its surface showed the presence of about 20% of vanadium. Thus, it was a layer of vanadium carbonitride.

EXAMPLE 21

Figure 22:
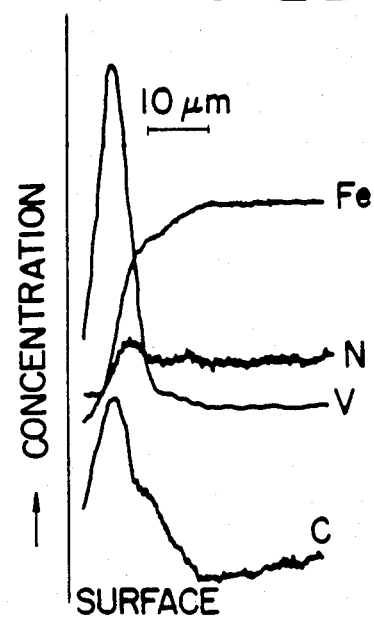

A specimen of AISI 1045 steel having a diameter of 7 mm and a length of 30 mm was given 60 hours of gas nitriding treatment at 570° C. Then, it was placed in a mixed powder of the same composition as that used in EXAMPLE 20 and was heated at 580° C. for 16 hours, whereby a surface layer was formed on the specimen. The surface layer was examined by an X-ray microanalyzer. It was found to be composed of vanadium, nitrogen and carbon, as shown in FIG. 22. The examination of the layer from its surface revealed the presence of about 40% of vanadium. Thus, it was a layer of vanadium carbonitride.

EXAMPLE 22

A paste was prepared from a mixed powder composed of 40% of $Al_2O_3$ having a particle size under 200 mesh, 55% of Fe-V containing 85% of vanadium having a particle size under 100 mesh and 5% of $NH_4Cl$ having a particle size of 80 to 100 mesh by using a solvent prepared by dissolving ethyl cellulose in ethyl alcohol. A specimen of AISI 1045 steel having a diameter of 20 mm and a length of 10 mm was gas nitrided under the conditions employed in EXAMPLE 21. The paste was applied to the surface of the nitrided specimen to form a layer having a thickness of 3 to 5 mm thereon. Then, the specimen was placed in a stainless steel vessel and heated at 580° C. for 16 hours in an argon gas atmosphere, whereby a surface layer was formed on the specimen.

The surface layer was examined by an X-ray microanalyzer. It was a layer of vanadium carbonitride.

EXAMPLE 23

A mixed powder composed of 60% of $Al_2O_3$ having a particle size under 80 mesh, 38.8% of Fe-V having a particle size under 100 mesh and 1.2% of $VCl_3$ having a particle size under 80 mesh was placed in a fluidized bed furnace. Argon gas was introduced into the furnace through its bottom to fluidize the powder. The argon gas had a flow rate of 200 cm/min. in the furnace and a pressure of 1.5 kg/cm² when entering the furnace. A bar specimen of AISI W1 steel having a diameter of 7 mm and a length of 50 mm was nitrided in a salt bath under the conditions employed in EXAMPLE 13. Then, the specimen was placed in the furnace and heated at 580° C. for eight hours, whereby a surface layer was formed thereon.

Figure 23:
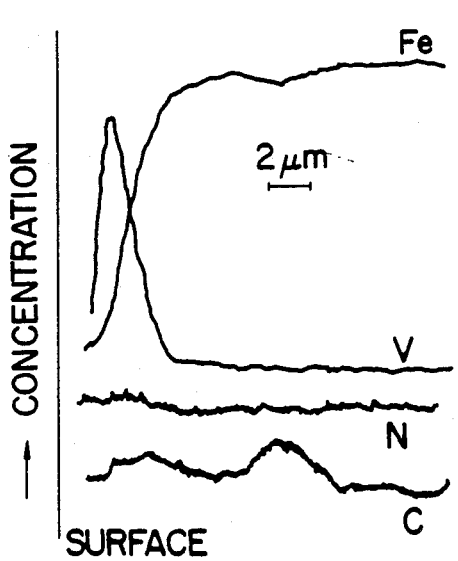

The surface layer was examined by an X-ray microanalyzer. It was found to be composed of vanadium, nitrogen and carbon, as shown in FIG. 23. The analysis of the layer from its surface revealed the presence of about 30% of vanadium therein. The examination of the layer by X-ray diffraction gave a diffraction pattern of VN. Thus, it was a layer of (V,Fe)(C,N).

EXAMPLE 24

A specimen of AISI W1 steel having a diameter of 7 mm and a length of 50 mm was nitrided in a salt bath at 570° C. for four hours. A mixed powder composed of 58.8% of $Al_2O_3$ having a particle size under 80 mesh, 40% of Fe-Nb having a particle size under 100 mesh and 1.2% of $NH_4Cl$ having a particle size under 80 mesh was placed in a fluidized bed furnace. Argon gas was introduced into the furnace through its bottom to fluidized the powder. The argon gas had a pressure of 1.5 kg/cm² when entering the furnace and was caused to flow therethrough at a rate of 200 cm/min. Then, the specimen was placed in the furnace and heated at 580° C. for 16 hours, whereby a surface layer was formed thereon.

Figure 24:
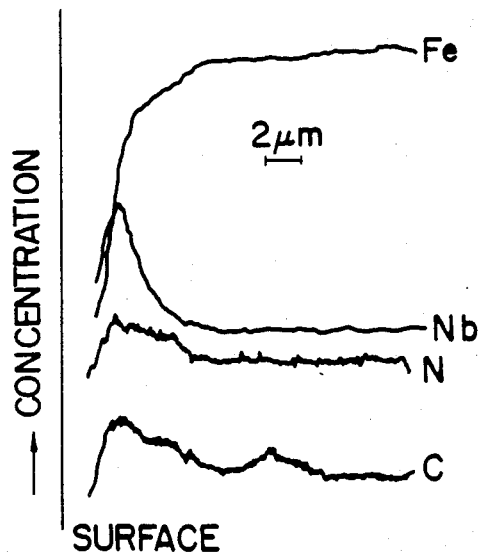

The surface layer was examined by an X-ray microanalyzer. It was found to be composed of niobium, nitrogen and carbon, as shown in FIG. 24. The analysis of the layer from its surface revealed the presence of about 20% of niobium therein. The examination of the layer by X-ray diffraction gave a diffraction pattern of NbN. Thus, it was a layer of (Nb,Fe)(C,N).

EXAMPLE 25

A specimen of AISI M2 steel in the form of a sheet having a length of 60 mm, a width of 20 mm and a thickness of 10 mm was nitrided in a salt bath under the conditions employed in EXAMPLE 1. A mixture composed of 52 mol % of $CaCl_2$ and 48 mol % of NaCl was placed in a vessel made of heat-resistant steel and was heated to 570° C. in an atmospheric electric furnace to prepare a molten salt bath. A powder of Fe-V containing 85% of vanadium having a particle size under 200 mesh was added to the bath. The amount of the powder added was 25% of the weight of the bath. The specimen was immersed in the bath at 570° C. and when eight hours had passed, it was taken out and quenched in oil.

The surface layer which had been formed on the specimen was examined by X-ray diffraction. It gave a diffraction pattern of VN. Thus, it was a layer of vanadium carbonitride.

Then, the specimen was subjected to a dry wear test by means of an Ogoshi's fast wear testing machine employing a testing member formed from spheroidizing annealed SCM415 (JIS) steel. The test was conducted at a final load of 3.3 kg, a slip distance of 600 m and a slip rate of 2 m/sec. The specimen will hereinafter be referred to as Specimen No. C2.

For the sake of comparison, the same test was conducted on a specimen of AISI M2 steel which had not been nitrided or treated as hereinabove described (Specimen No. S5) and a specimen of AISI M2 steel which had been nitrided, but had not been treated (Specimen No. S6)

The results of the tests are shown in a table below. As is obvious from the table, the surface layer which had been formed on Specimen No. C2 showed a higher degree of wear resistance than the surfaces of Specimens Nos. S5 and S6.

TABLE

| Specimen | | Wear (mm$^3$/kg-m) | | |
| --- | --- | --- | --- | --- |
| | | C2 | S5 | S6 |
| Slip rate | 2 m/sec. | 1.3 | 8 | 5.5 |
| | 4.4 m/sec. | 0.8 | 18 | 16 |
| | | Invention | Comparative | |

The same wear test was also conducted on a specimen of AISI M2 steel having a approximately four-micron thick layer of vanadium carbide (VC) formed by two hours of immersion in a salt bath having a temperature of 1000° C. and on a specimen of AISI M2 steel having an approximately seven-micron thick layer of titanium carbonitride TI (C,N) formed by four hours of CVD at 850° C. There was no appreciable difference in wear between these specimens and Specimen No. C2. Therefore, it is evident that this invention makes it possible to form a surface layer which is comparable in wear and seizing resistance to the surface layer formed by the high temperature salt bath immersion or CVD method.

EXAMPLE 26

Figure 25:
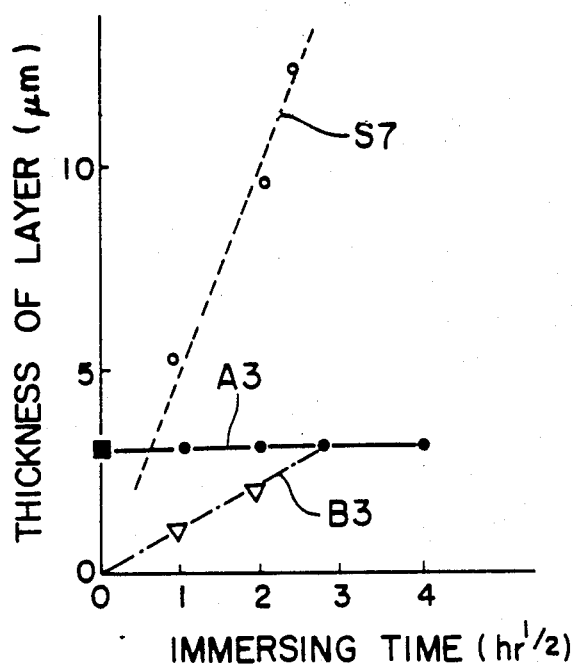

A plurality of specimens each in the form of a round bar of AISI M2 steel having a diameter of 6 mm and a length of 30 mm were nitrided in a salt bath having a temperature of 570° C. for an hour. A vessel made of heat-resistant steel and holding a mixture composed of 52 mol % of CaCl$_2$ and 48 mol % of NaCl was heated in an atmospheric electric furnace to prepare a molten salt bath having a temperature of 550° C. A powder of metallic titanium having a particle size under 100 mesh was added to the bath. The amount of the powder added was 20% of the weight of the bath. The specimens were immersed in the bath and when different periods of time ranging from one to 16 hours had passed, they were taken out and quenched in oil. After the bath material adhering to the specimens had been washed away, a section of each specimen was ground to prepare a cross-sectional surface for use in structure determination and the thickness of the surface layer which had been formed on each specimen was measured. The results are shown by curve A3 in FIG. 25. The thickness of the layer shown by curve A3 at the immersing time of 0 hour is the thickness of the initially formed nitride layer. The thickness which is shown thereafter, beginning at the immersing time of 1 hour, is the thickness of the whole surface layer, i.e., the total thickness of the remaining nitride layer and the growing titanium carbonitride layer. The thickness of the carbonitride layer per se is shown by curve B3. The thickness of the whole surface layer did not show any appreciable change irrespective of the immersing time, but was about three microns on all of the specimens.

Figure 27:
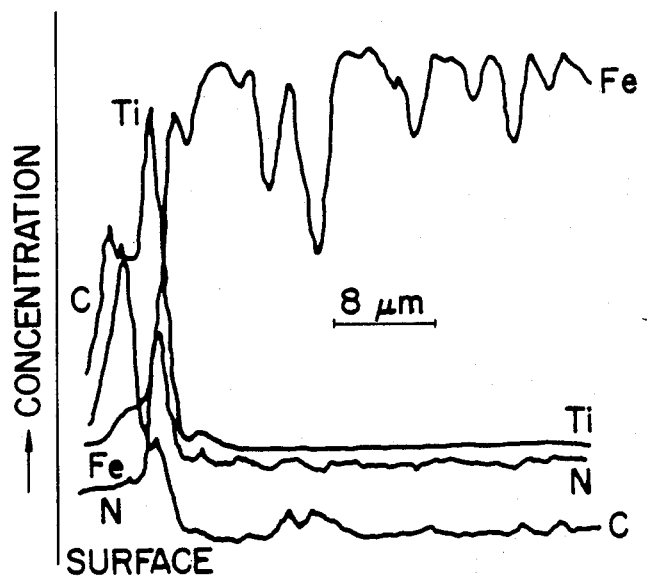
Figure 26:
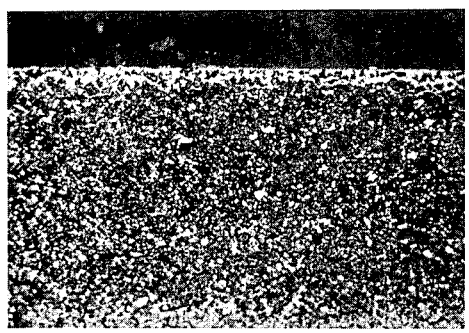

FIG. 26 is a photomicrograph of 400 magnifications showing in profile the surface layer which was formed on the specimen treated for nine hours. It was a layer having a smooth surface. The layer and the base material had therebetween a boundary having a complicated contour defining an intimate bond therebetween. The examination of the layer by an X-ray microanalyzer revealed the presence of nitrogen and carbon in addition to titanium, as shown in FIG. 27. The examination of the layer by X-ray diffraction gave a diffraction pattern of TiN. Thus, it was a layer of titanium carbonitride (Ti,Fe)(N,C).

For the sake of comparison, a number of specimens of AISI M2 steel were nitrided under the same conditions and treated in a salt bath of the same composition which had been heated to 1000° C., whereby a layer of titanium carbonitride was formed on the surface of each specimen. The thickness of the layer is shown by curve S7 in FIG. 25. The thickness increased with an increase in immersing time. As such was not the case with the surface layer formed in accordance with this invention, it is evident that the mechanism of its formation differed from the mechanism through which the layers were formed on the comparative specimens employing a higher temperature.

EXAMPLE 27

A plurality of specimens of AISI 1045 steel each having a diameter of 7 mm and a length of 50 mm were nitrided in a salt bath under the conditions employed in EXAMPLE 26. A molten salt bath of the same composition as that used in EXAMPLE 26 was prepared from CaCl$_2$ and NaCl. A powder of TiCl$_3$ having a particle size of 320 mesh was added to the bath. The amount of the powder added was 15% of the weight of the bath. The bath was heated to 500° C. and the specimens were immersed therein. When different periods of time ranging from one to 16 hours had passed, they were taken out and quenched in oil.

Figure 28:
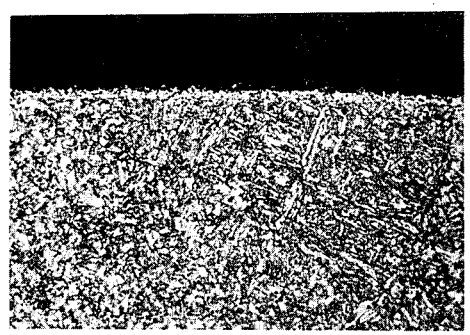
Figure 29:
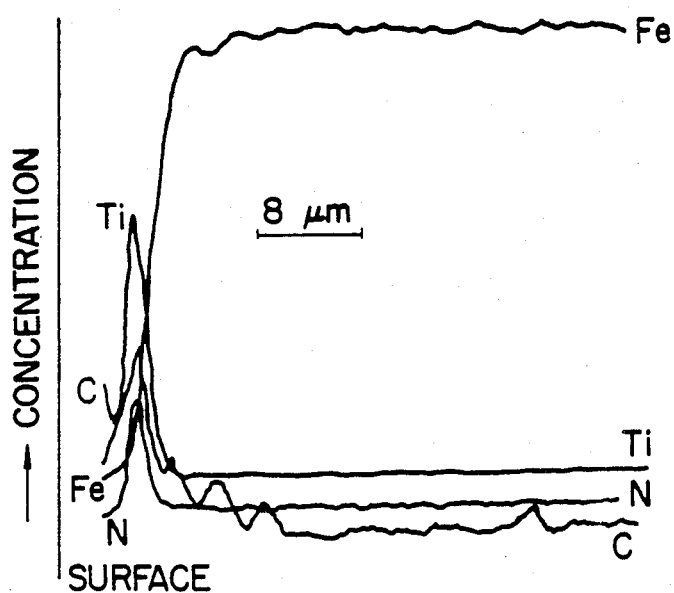

The surface layers which had been formed on the specimens were all of substantially the same thickness and structure, irrespective of the immersing time. Referring by way of example to the specimen which was treated for six hours, FIG. 28 is a photomicrograph of 400 magnifications showing a profile of the surface layer formed thereon. It had a thickness of about five microns. The examination of the layer by X-ray diffraction and by an X-ray microanalyzer showed that it was a layer of titanium carbonitride (Ti,Fe)(N,C). The results of the examination by the X-ray microanalyzer are shown in FIG. 29.

EXAMPLE 28

A plurality of cylindrical specimens of AISI 1048 steel each having an outside diameter of 10 mm, an inside diameter of 6 mm and a length of 25 mm were given five hours of gas soft-nitriding treatment at 570° C. A molten salt bath of the same composition as that used in EXAMPLE 1 was prepared from CaCl$_2$ and NaCl. A powder of Al$_2$O$_3$ having a particle size under 320 mesh and a powder of ferrotitanium containing 45% of titanium having a particle size under 200 mesh were added to the bath. The amounts of the alumina and ferrotitanium added were 3% and 25%, respectively, of the weight of the bath. The bath was heated to 550° C. and the specimens were immersed therein. When nine hours had passed, they were taken out and quenched in oil.

The specimens were examined for roundness. They were substantially of the same roundness and showed a roundness deviation of only about six microns at both the unner and lower ends thereof. For the sake of comparison, a specimen which had been immersed in a salt bath having a temperature of 850° C. for four hours showed a roundness deviation of about 25 microns which was about four times greater than that of any of the specimens which had been treated in accordance with this invention.

The specimens which had been treated at 550° C. for nine hours in accordance with this invention were cut to expose the surface layer which had been formed thereon. It had a thickness of about five microns. The examination of the layer by X-ray diffraction and by an X-ray microanalyzer showed that it was a layer of titanium carbonitride (Ti,Fe)(N,C). The analysis of the layer from its surface by an X-ray microanalyzer revealed that it contained nitrogen and carbon in addition to about 40% of titanium.

EXAMPLE 29

A specimen of AISI M2 steel having a diameter of 6 mm and a length of 30 mm was ionically nitrided at 550° C. for five hours. A molten salt bath of the same composition as that used in EXAMPLE 26 was prepared from $CaCl_2$ and NaCl in a graphite vessel. A bar of metallic titanium having a diameter of 10 mm and a length of 50 mm was placed in the center of the bath. The bar was used as an anode, and the graphite vessel as a cathode. An electric current was supplied to the anode at a density of 0.5 $A/cm^2$ for about 16 hours. The decrease in weight of the titanium bar showed that the anodic dissolution of titanium had resulted in the bath containing about 10% of titanium.

The specimen was immersed in the bath at 550° C. and when eight hours had passed, it was taken out and quenched in oil. The specimen was cut for examination by an X-ray microanalyzer. The surface layer which had been formed thereon was a layer of titanium carbonitride.

EXAMPLE 30

A specimen of AISI 1045 steel having a diameter of about 7 mm and a length of 50 mm was nitrided in a salt bath having a temperature of 570° C. for an hour. A graphite vessel holding a mixture composed of 50 mol % of KF and 50 mol % of LiF was heated to 600° C. in an air atmospheric electric furnace to prepare a molten salt bath. A powder of metallic titanium having a particle size under 100 mesh was added to the bath. The amount of the powder added was 25% of the weight of the bath. The specimen was immersed in the bath. An electric current was supplied to carry out electrolysis at a cathode current density of 0.08 $A/cm^2$ for eight hours using the specimen as a cathode and the graphite vessel as an anode, whereby a surface layer was formed on the specimen.

The specimen was taken out and quenched in oil. Then, the surface layer was examined by an X-ray microanalyzer. It was a layer of (Ti,Fe)(C,N). The analysis of the layer from its surface showed that it contained nitrogen and carbon in addition to about 50% of titanium.

EXAMPLE 31

A specimen of industrial pure iron having a diameter of 8 mm and a length of 35 mm was ionically nitrided under the conditions employed in EXAMPLE 29. The pure iron did not contain more than 0.03% of carbon. A molten salt bath of the same composition as that used in EXAMPLE 26 was prepared from $CaCl_2$ and NaCl in a steel vessel. A powder of Fe-Ti containing 45% of titanium having a particle size under 200 mesh was added to the bath. The amounts of the powder added was 30% of the weight of the bath. The bath was heated to 600° C. and the specimen was immersed therein. After eight hours had passed, it was taken out and quenched in oil.

Figure 30:

FIG. 30 is a photomicrograph of 400 magnifications showing in profile the surface layer which was formed on the specimen. It had a thickness of about 10 microns which was substantially equal to the thickness of the ionically nitrided layer. The analysis of the layer from its surface by an X-ray microanalyzer showed that it contained nitrogen and carbon in addition to about 50% of titanium. Thus, it was a layer of titanium carbonitride.

EXAMPLE 32

A specimen of AISI M2 steel was nitrided in a salt bath under the conditions employed in EXAMPLE 1. A vessel made of heat-resistant steel and holding a mixture composed of 45% of $Li_2CO_3$, 25% of $K_2CO_3$ and 30% of $Na_2CO_3$ was heated to 550° C. in an air atmospheric furnace to prepare a molten salt bath. A powder of metallic titanium having a particle size under 100 mesh was added to the bath. The amount of the powder added was 30% of the weight of the bath. The bath was fully stirred and the specimen was immersed therein. After five hours had passed, it was taken out and quenched in oil.

The surface layer which had been formed on the specimen was examined by an X-ray microanalyzer. It was a layer of (Ti,Fe)(C,N).

EXAMPLE 33

A specimen of AISI 1045 steel having a diameter of 8 mm and a length of 30 mm was given 150 minutes of gas soft-nitriding treatment at 570° C. Then, it was placed in a stainless steel vessel holding a mixed powder composed of 90% of Fe-Ti containing 45% of titanium having a particle size under 100 mesh and 10% of potassium borofluoride ($KBF_4$) having a particle size under 100 mesh, so that the specimen might be buried in the powder. A power of ferroboron having a particle size under 100 mesh was placed on the mixed powder to form an antioxidizing layer having a thickness of 3 to 4 mm. The vessel was heated at 600° C. for 16 hours in an atmospheric furnace. Then, the vessel was taken out of the furnace and after it had been cooled by air, the specimen was removed from the powder.

The surface layer which had been formed on the specimen was examined by an X-ray microanalyzer. It was a layer composed of titanium, nitrogen and carbon. The analysis of the layer from its surface showed that it contained about 35% of titanium. Thus, it was a layer of titanium carbonitride.

EXAMPLE 34

A paste was prepared from a mixed powder composed of 40% of $Al_2O_3$ having a particle size under 200 mesh, 55% of Fe-Ti containing 45% of titanium having a particle size under 100 mesh and 5% of NH$_4$Cl having a particle size under 80 mesh by using a solvent prepared by dissolving ethyl cellulose in ethyl alcohol. A specimen of AISI W1 steel having a diameter of 20 mm and a length of 10 mm was given gas soft-nitriding treatment under the conditions employed in EXAMPLE 33. The paste was applied to the surface of the specimen to form a layer having a thickness of 3 to 5 mm thereon. Then, the specimen was placed in a stainless steel vessel and heated at 600° C. for 16 hours in an argon gas atmosphere, whereby a surface layer was formed on the specimen.

The surface layer was examined by an X-ray microanalyzer. It was a layer of titanium carbonitride.

EXAMPLE 35

A mixed powder composed of 60% of Al$_2$O$_3$ having a particle size under 80 mesh, 38.8% of Fe-Ti containing 45% of titanium having a particle size under 100 mesh and 1.2% of NH$_4$Cl having a particle size under 80 mesh was placed in a fluidized bed furnace. Argon gas was introduced into the furnace through its bottom to fluidize the powder. The argon gas had a pressure of 5 kg/cm$^2$ when entering the furnace and was caused to flow therethrough at a rate of 200 cm/min. A specimen of AISI H13 steel having a diameter of 7 mm and a length of 50 mm, which had been nitrided in a salt bath under the conditions employed in EXAMPLE 26, was placed in the furnace and heated at 600° C. for 16 hours, whereby a surface layer was formed on the specimen.

Figure 31:
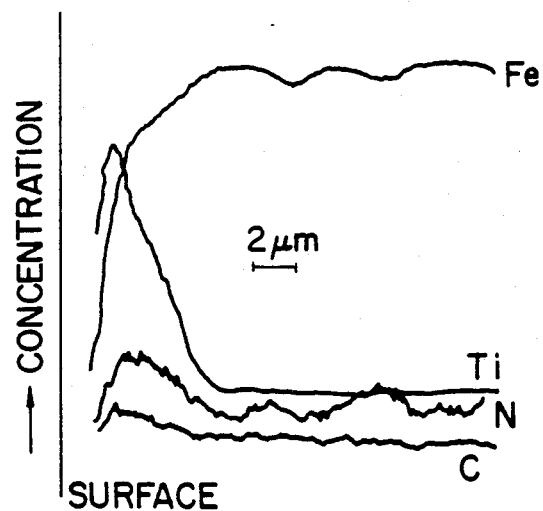

The surface layer was examined by an X-ray microanalyzer. It was a layer composed of titanium, nitrogen and carbon, as shown in FIG. 31. The surface analysis of the layer showed that it contained about 30% of titanium. The examination of the layer by X-ray diffraction gave a diffraction pattern of TiN. Thus, it was a layer of (Ti,Fe)(C,N).

EXAMPLE 36

A specimen of AISI W1 steel having a diameter of 7 mm and a length of 50 mm was nitrided in a salt bath having a temperature of 570° C. for four hours. A mixed powder composed of 58.8% of Al$_2$O$_3$ having a particle size under 80 mesh, 40% of Fe-Ti containing 45% of titanium having a particle size of 100 to 200 mesh and 1.2% of NH$_4$Cl having a particle size under 80 mesh was placed in a fluidized bed furnace. Argon gas was introduced into the furnace through its bottom to fluidize the powder. The argon gas had a pressure of 1.5 kg/cm$^2$ when entering the furnace and was caused to flow therethrough at a rate of 200 cm/min. The specimen was placed in the furnace and heated at 600° C. for 16 hours, whereby a surface layer was formed thereon.

The surface layer was examined by an X-ray microanalyzer. It was a layer composed of titanium, nitrogen and carbon. The surface analysis of the layer showed that it contained about 20% of titanium. The examination of the layer by X-ray diffraction gave a diffraction pattern of TiN. Thus, it was a layer of (Ti,Fe)(C,N).

EXAMPLE 37

A specimen of AISI M2 steel having a diameter of 6.5 mm and a length of 40 mm was nitrided in a salt bath under the conditions employed in EXAMPLE 26. A mixture composed of 52 mol % of CaCl$_2$ and 48 mol % of NaCl was placed in a vessel made of heat-resistant steel and was heated to 550° C. in an atmospheric electric furnace to prepare a molten salt bath. A powder of Fe-Ti containing 45% of titanium having a particle size under 200 mesh was added to the bath. The amount of the powder added was 25% of the weight of the bath. The specimen was immersed in the bath and heated at 550° C. for eight hours, whereby a surface layer was formed thereon. Then, it was taken out and quenched in oil.

The examination of the surface layer by X-ray diffraction gave a diffraction pattern of TiN. Thus, it was a layer of titanium carbonitride. This specimen will hereinafter be referred to as Specimen No. C3.

A dry friction test was conducted on Specimen No. C3 by means of a Falex lubricant testing machine employing a testing member formed from gas carburized SCM415 (JIS) steel. The test was conducted at a load of 400 kg, a rotating speed of 300 rpm and a friction rate of 0.1 m/sec.

For the sake of comparison, the same friction test was conducted on a specimen of AISI M2 steel which had not been nitrided or treated (Specimen No. S8) and a specimen of AISI M2 steel which had been nitrided, but had not been treated (Specimen No. S9).

The results of the tests are shown in a table below. Both of Specimens Nos. S8 and S9 showed clear marks of seizing, but Specimen No. C3 was only negligibly damaged. Therefore, it is evident that this invention can form a surface layer which is superior in wear and seizing resistance to the surface of any material such as Specimen No. S8 or S9.

TABLE

| Specimen No. | C3 | S8 | S9 |
|---|---|---|---|
| Wear (mg/cm$^2$) | 4 | 12 | 9 |
| | Invention | Comparative | |

EXAMPLE 38

Figure 32:
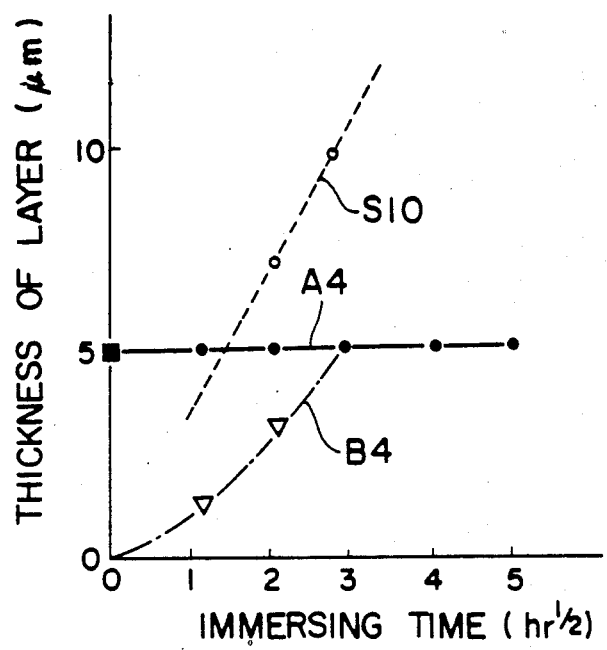

A plurality of specimens each in the form of a round bar of AISI M2 steel having a diameter of 6 mm and a length of 30 mm were nitrided in a salt bath having a temperature of 570° C. for three hours. A mixture composed of 52 mol % of CaCl$_2$ and 48 mol % of NaCl was placed in a vessel made of heat-resistant steel and was heated to 550° C. in an atmospheric electric furnace to prepare a molten salt bath. A powder of ferrozirconium (Fe-Zr) containing 80% of zirconium, which had a particle size under 100 mesh, was added to the bath. The amount of the powder added was 25% of the weight of the bath. The specimens were immersed in the bath and after they had been held at 550° C. therein for different periods of time ranging from one to 25 hours, they were taken out and quenched in oil. After the bath material adhering to the specimens had been washed away, a section of each specimen was ground to prepare a cross-sectional surface for use in structure determination and the thickness of the layer which had been formed on each specimen was measured. The results are shown by curve A4 in FIG. 32. The thickness of the layer which is shown by curve A4 at the immersing time of 0 hour is that of the initially formed nitride layer. The thickness which is shown thereafter, beginning at the immersing time of 1 hour, is the thickness of the whole surface layer, i.e., the total thickness of the remaining nitride layer and the growing layer of zirconium carbonitride. The thickness of the carbonitride layer per se is shown by curve B4. The thickness of the surface layer did not show any appreciable change irrespective of the immersing time, but was about five microns on all the specimens.

Figure 34:
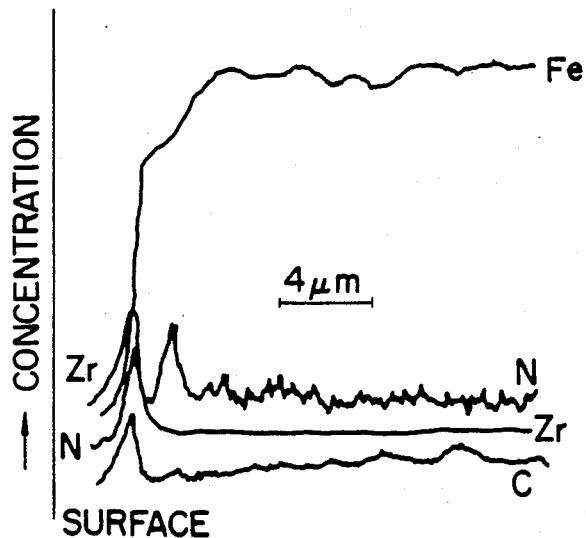
Figure 33:
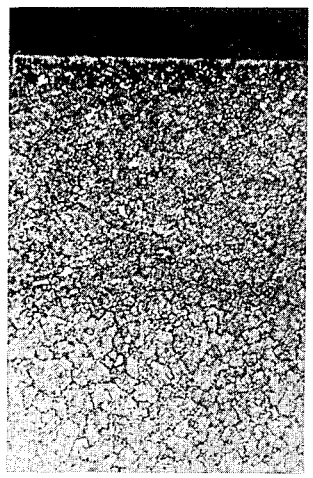

FIG. 33 is a photomicrograph of 400 magnifications showing in profile the surface layer which was formed by nine hours of immersion. It was a layer having a smooth surface. The layer and the base material had therebetween a boundary having a complicated contour forming an intimate bond therebetween. The examination of the layer by an X-ray microanalyzer indicated that it contained nitrogen and carbon in addition to zirconium, as shown in FIG. 34. The surface analysis of the layer showed that it contained about 50% of zirconium. The examination of the layer by X-ray diffraction gave a diffraction pattern of ZrN. Thus, it was a layer of zirconium carbonitride (Zr,Fe)(N,C).

For the sake of comparison, a plurality of specimens of AISI M2 steel were nitrided under the same compositions and immersed in a salt bath of the same composition heated to 1000° C., whereby a layer of zirconium carbonitride was formed on the surface of each specimen. The surface layers on these specimens had a thickness increasing with an increase in immersing time, as shown by curve S10 in FIG. 32. As such was not the case with the surface layers formed in accordance with this invention (see curve A4), it is evident that the mechanism of their formation differed from the mechanism through which the surface layers were formed on the comparative specimens which had been heated at a higher temperature.

EXAMPLE 39

A plurality of specimens of AISI 1045 steel each having a diameter of 7 mm and a length of 50 mm were nitrided in a salt bath under the conditions employed in EXAMPLE 38. A molten salt bath of the composition used in EXAMPLE 38 was prepared from $CaCl_2$ and NaCl. A powder of $ZrCl_4$ having a particle size under 320 mesh was added to the bath. The amount of the powder added was 15% of the weight of the bath. The bath was heated to 500° C. and the specimens were immersed therein for different periods of time ranging from one to 16 hours, whereby a surface layer was formed on each specimen. Then, each specimen was taken out and quenched in oil.

Figure 35:
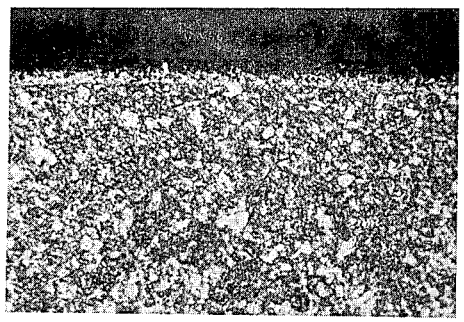
Figure 36:
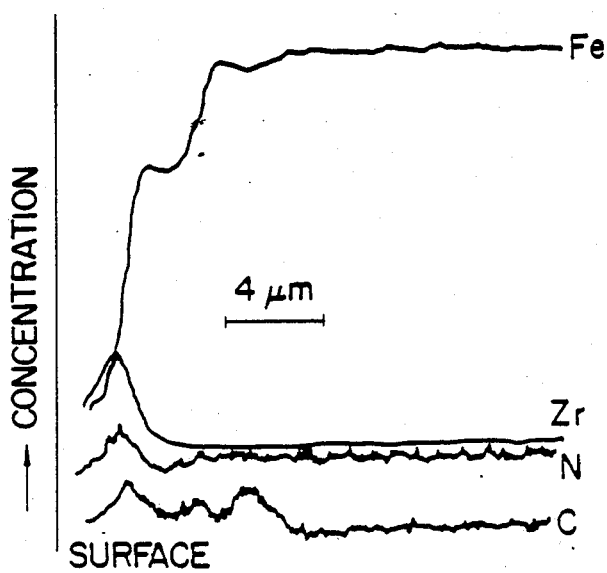

The surface layers were all of substantially the same thickness and structure irrespective of the immersing time. Referring by way of example to the specimen treated by four hours of immersion, FIG. 35 is a photomicrograph of 400 magnifications showing a profile of the surface layer formed thereon. It had a thickness of about six microns. It was examined by X-ray diffraction and by an X-ray microanalyzer. The results of the examination by the X-ray microanalyzer are shown in FIG. 36. It was a layer of zirconium carbonitride (Zr,Fe)(N,C).

EXAMPLE 40

A plurality of cylindrical specimens of AISI 1048 steel each having an outside diameter of 10 mm, an inside diameter of 6 mm and a length of 25 mm were given six hours of gas soft-nitriding treatment at 570° C. A molten salt bath of the composition used in EXAMPLE 38 was prepared from $CaCl_2$ and NaCl. A powder of $Al_2O_3$ having a particle size under 320 mesh and a powder of Fe-Zr having a particle size under 200 mesh were added to the bath. The amounts of the alumina and ferrozirconium added were 3% and 30%, respectively, of the weight of the bath. The ferrozirconium had a zirconium content of 80%. Then, the bath was heated to 550° C. and the specimens were immersed therein. They were held in the bath for three different periods of time, i.e., 1, 9 and 25 hours, respectively. Then, they were taken out and quenched in oil.

Then, the specimens were examined for roundness. They were all substantially of the same roundness and showed a roundness deviation of only about five microns at both the upper and lower ends thereof. For the sake of comparison, a specimen which had been immersed in a bath having a temperature of 850° C. for four hours showed a roundness deviation of about 20 microns which was about four times greater than that of any of the specimens which had been treated in accordance with this invention.

One of the specimens treated in accordance with this invention, which had been treated at 550° C. for nine hours, was cut in profile and its surface layer was examined. It had a thickness of about eight microns. The analysis of the layer by an X-ray microanalyzer showed that it was a layer of zirconium carbonitride (Zr,Fe)(N,C).

EXAMPLE 41

A specimen of AISI M2 steel having a diameter of 6 mm and a length of 30 mm was ionically nitrided at 550° C. for four hours. A molten salt bath of the composition used in EXAMPLE 38 was prepared from $CaCl_2$ and NaCl in a graphite vessel. A sheet of metallic zirconium having a length of 40 mm, a width of 35 mm and a thickness of 4 mm was placed in the center of the bath. This sheet was used as an anode, and the graphite vessel as a cathode. An electric current was supplied to the anode at a density of 0.7 $A/cm^2$ for about 20 hours, whereby zirconium was anodically dissolved in the bath. The resulting decrease in weight of the zirconium sheet taught that the bath contained about 6% of zirconium dissolved therein. The specimen was immersed in the bath and heated at 550° C. for eight hours. Then, it was taken out and quenched in oil.

Then, the specimen was cut in profile and the surface layer which had been formed thereon was examined by an X-ray microanalyzer. It was found to contain carbon, as well as zirconium and nitrogen. The examination of the layer by X-ray diffraction gave a diffraction pattern coinciding closely with that of ZrN. Thus, it was a layer of zirconium carbonitride.

EXAMPLE 42

A specimen of AISI 1045 steel having a diameter of about 7 mm and a length of 50 mm was nitrided in a salt bath having a temperature of 570° C. for an hour. A mixture composed of 50 mol % of KF and 50 mol % of LiF was placed in a graphite vessel and heated to 600° C. in an atmospheric electric furnace to prepar a molten salt bath. A powder of Fe-Zr containing 80% of zirconium, which had a particle size under 100 mesh, was added to the bath. The amount of the powder added was 30% of the weight of the bath. The specimen was immersed in the bath as a cathode, while the graphite vessel was used as an anode. An electric current was supplied to carry out electrolysis at a cathode current density of 0.05 $A/cm^2$ for eight hours, whereby a surface layer was formed on the specimen. Then, it was taken out and quenched in oil.

The surface layer was examined by an X-ray microanalyzer. It was a layer of (Zr,Fe)(C,N). The surface analysis of the layer showed that it contained nitrogen and carbon in addition to about 65% of zirconium.

EXAMPLE 43

A specimen of industrial pure iron having a diameter of 8 mm and a length of 35 mm was ionically nitrided under the conditions employed in EXAMPLE 41. The iron had a carbon content not exceeding 0.03%. A molten salt bath of the composition used in EXAMPLE 38 was prepared from $CaCl_2$ and NaCl in a steel vessel. A powder of Fe-Zr containing 80% of zirconium, which had a particle size of 200 mesh, was added to the bath. The amount of the powder added was 30% of the weight of the bath. The bath was heated to 600° C. and the specimen was immersed therein. When eight hours had passed, it was taken out and quenched in oil.

Figure 37:
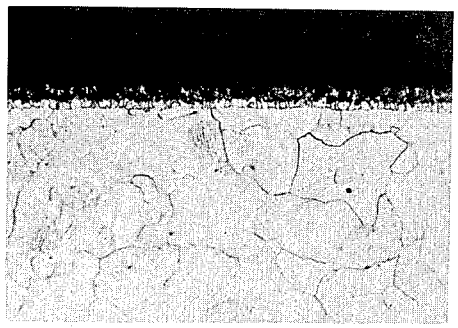

FIG. 37 is a photomicrograph of 400 magnifications showing a profile of the surface layer which was formed on the specimen. It had a thickness of about 12 microns which was substantially equal to the thickness of the initially formed nitride layer. The examination of the layer by an X-ray microanalyzer showed that it contained nitrogen and carbon in addition to about 50% of zirconium. Thus, it was a layer of zirconium carbonitride.

EXAMPLE 44

A specimen of AISI D2 steel was nitrided in a salt bath under the conditions employed in EXAMPLE 38. A mixture composed of 45% of $Li_2CO_3$, 25% of $K_2CO_3$ and 30% of $Na_2CO_3$ was placed in a vessel made of heat-resistant steel and was heated to 520° C. in a controlled atmosphere furnace to prepare a molten salt bath. A powder of metallic zirconium having a particle size under 200 mesh was added to the bath. The amount of the powder added was 30% of the weight of the bath. After the bath had been fully stirred, the specimen was immersed therein and heated at 520° C. for five hours, whereby a surface layer was formed on the specimen. Then, it was taken out and quenched in oil.

Figure 38:
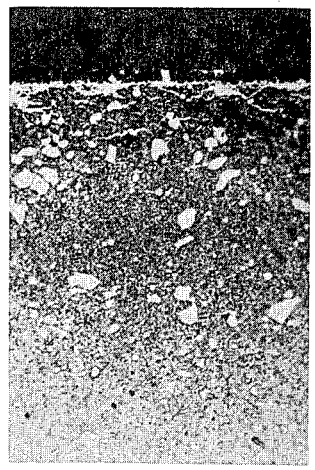

The surface layer was examined by an X-ray microanalyzer. It was a layer of (Zr,Fe)(C,N). FIG. 38 is a photomicrograph of 400 magnifications showing a profile of the surface layer. It had a thickness of about five microns which was substantially equal to the thickness of the initially formed nitride layer.

EXAMPLE 45

A specimen of AISI 1045 steel having a diameter of 8 mm and a length of 30 mm was given 150 minutes of gas soft-nitriding treatment at 570° C. A mixed powder composed of 90% of Fe-Zr having a zirconium content of 70% and 10% of $KBF_4$ and having a particle size under 100 mesh was placed in a stainless steel vessel and the specimen was placed in the powder. A powder of ferroboron having a particle size under 100 mesh was placed on the mixed powder to form an antioxidizing layer having a thickness of 3 to 4 mm. The vessel was heated at 600° C. for 16 hours in an atmospheric furnace. The vessel was taken out of the furnace and after it had been cooled by air, the specimen was removed from the powder.

The surface layer which had been formed on the specimen was examined by an X-ray microanalyzer. It was a layer composed of zirconium, nitrogen and carbon. The surface analysis of the layer showed that it contained about 20% of zirconium. Thus, it was a layer of zirconium carbonitride.

EXAMPLE 46

A paste was prepared from a mixed powder composed of 40% of $Al_2O_3$ having a particle size under 200 mesh, 55% of Fe-Zr having a particle size under 100 mesh, which had a zirconium content of 70%, and 5% of $NH_4Cl$ having a particle size of 80 to 100 mesh by using a solvent prepared by dissolving ethyl cellulose in ethyl alcohol. A specimen of AISI W1 steel having a diameter of 20 mm and a length of 10 mm was given 60 hours of gas soft-nitriding treatment at 570° C. The paste was applied to the surface of the specimen to form a layer having a thickness of 3 to 5 mm thereon. Then, the specimen was placed in a stainless steel vessel and heated at 600° C. for 16 hours in an argon gas atmosphere, whereby a surface layer was formed on the specimen.

The surface layer was examined by an X-ray microanalyzer. It was a layer of zirconium carbonitride.

EXAMPLE 47

A mixed powder composed of 60% of $Al_2O_3$ having a particle size under 80 mesh, 38.8% of Fe-Zr having a particle size under 100 mesh, which had a zirconium content of 70%, and 1.2% of $NH_4Cl$ having a particle size under 80 mesh was placed in a fluidized bed furnace. Argon gas was introduced into the furnace through its bottom to fluidize the powder. The argon gas had a pressure of 1.5 kg/cm² when entering the furnace and was caused to flow therethrough at a rate of 200 cm/min. A specimen of AISI W1 steel having a diameter of 7 mm and a length of 50 mm, which had been nitrided in a salt bath under the conditions employed in EXAMPLE 1, was placed in the furnace and heated at 600° C. for 16 hours, whereby a surface layer was formed on the specimen.

Figure 39:
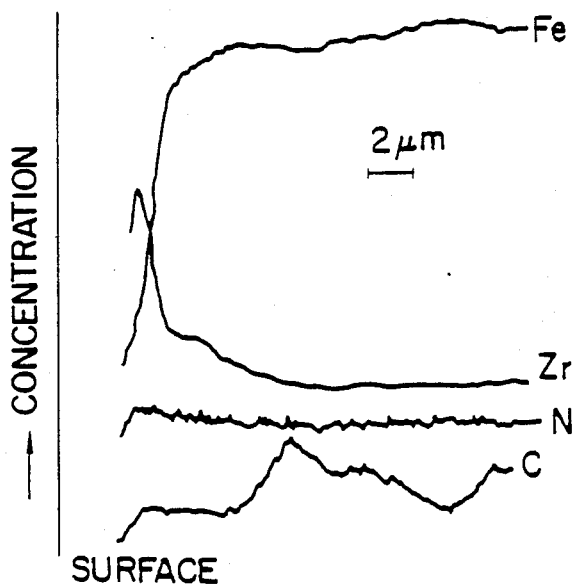

The surface layer was examined by an X-ray microanalyzer. It was composed of zirconium, nitrogen and carbon, as shown in FIG. 39. The surface analysis of the layer showed that it contained about 20% of zirconium. The examination of the layer by X-ray diffraction gave diffraction pattern coinciding closely with that of ZrN. Thus, it was a layer of (Zr,Fe)(C,N).

EXAMPLE 48

A specimen of AISI H13 steel having a diameter of 7 mm and a length of 50 mm was nitrided in a salt bath having a temperature of 570° C. for four hours. A mixed powder composed of 58.8% of $Al_2O_3$ having a particle size under 80 mesh, 40% of Fe-Zr having a particle size under 100 mesh, which had a zirconium content of 70%, and 1.2% of $NH_4Cl$ having a particle size under 80 mesh was placed in a fluidized bed furnace. Argon gas was introduced into the furnace through its bottom to fluidize the powder. The argon gas had a pressure of 1.5 kg/cm² when entering the furnace and was caused to flow therethrough at a rate of 200 cm/min. The specimen was placed in the furnace and heated at 600° C. for 16 hours, whereby a surface layer was formed thereon.

The surface layer was examined by an X-ray microanalyzer. It was composed of zirconium, nitrogen and carbon. The surface analysis of the layer showed that it contained about 20% of zirconium. The examination of the layer by X-ray diffraction gave a diffraction pattern coinciding closely with that of ZrN. Thus, it was a layer of (Zr,Fe)(C,N).

EXAMPLE 49

A specimen of AISI M2 steel having a diameter of 6.5 mm and a length of 40 mm was nitrided in a salt bath under the conditions employed in EXAMPLE 38. A mixture composed of 52 mol % of $CaCl_2$ and 48 mol % of NaCl was placed in a vessel made of heat-resistant steel and was heated to 550° C. in an atmospheric electric furnace to prepare a molten salt bath. A powder of Fe-Zr having a zirconium content of 80%, which had a particle size under 200 mesh, was added to the bath. The amount of the powder added was 25% of the weight of the bath. The specimen was immersed in the bath and heated at 550° C. for eight hours, whereby a surface layer was formed thereon. Then, it was taken out and quenched in oil.

The surface layer was examined by X-ray diffraction. It gave a diffraction pattern coinciding with that of ZrN. Thus, it was a layer of zirconium carbonitride. This specimen will hereinafter be referred to as Specimen No. C4.

A dry friction test was conducted on Specimen No. C4 by means of a Falex lubricant testing machine using a testing member formed from gas carburized SCM415 (JIS) steel. The test was conducted at a load of 400 g, a rotating speed of 300 rpm and a friction rate of 0.1 m/sec.

For the sake of comparison, the same test was conducted on a specimen of AISI M2 steel which had not been nitrided or heat treated (Sepcimen No. S11) and a specimen of AISI M2 steel which had been nitrided, but had not been heat treated (Specimen No. S12).

The results of the tests are shown in a table below. Both of Specimens Nos. S11 and S12 showed clear marks of seizing, but Specimen No. C4 was only negligibly damaged. Therefore, it is evident that this invention can form a surface layer which is superior in wear and seizing resistance to the surface of any material such as Specimen No. S11 or S12.

TABLE

| Specimen No. | C4 | S11 | S12 |
|---|---|---|---|
| Wear (mg/cm$^2$) | 5 | 12 | 9 |
| | Invention | Comparative | |

What is claimed is:

1. A method of treating the surface of an iron alloy material which comprises:
    nitriding said iron alloy material to form on said surface thereof a layer of a nitride composed of iron and nitrogen or a carbonitride composed of iron, carbon and nitrogen; and
    heating said iron alloy material at a temperature up to 580° C. with a material containing at least one surface layer-forming element selected from the group consisting of chromium, titanium and zirconium, and a treating agent, so that said surface layer-forming element may be diffused into said surface of said iron alloy material to form thereon a surface layer composed of a nitride or carbonitride of said element, said treating agent being at least one compound selected from the group consisting of chlorides, fluorides, borofluorides, oxides, bromides, iodides, carbonates, nitrates and borates of alkali and alkaline earth metals, ammonium halides and metal halides.

2. A method as set forth in claim 1, wherein said nitriding is carried out by a method selected from gas nitriding, gas soft-nitriding, salt bath soft-nitriding and glow discharge nitriding.

3. A method as set forth in claim 1, wherein said material containing at least one surface layer-forming element is at least one material selected from the group consisting of said element in pure metallic form, an alloy containing said element and a compound containing said element.

4. A method as set forth in claim 1, wherein said heating is carried out by immersing said iron alloy material and said material containing said element in a molten bath composed of said treating agent.

5. A method as set forth in claim 1, wherein said heating is carried out by employing said iron alloy material as a cathode and conducting electrolysis in a molten bath composed of said treating agent and holding said material containing said element.

6. A method as set forth in claim 1, wherein said heating is carried out by placing said iron alloy material in a mixed powder composed of said treating agent and said material containing said element.

7. A method as set forth in claim 1, wherein said heating is carried out after a paste prepared from a mixed powder composed of said treating agent and said material containing said element has been applied to said iron alloy material.

8. A method as set forth in claim 1, wherein when said iron alloy material is heated, it is kept away from contact with a mixed powder composed of said treating agent and said material containing said element.

9. A method as set forth in claim 1, wherein said iron alloy material is heated in a fluidized mixed powder composed of said treating agent and said material containing said element.

10. A method as set forth in claim 1, wherein said heating is carried out at a temperature of at least 450° C.

11. A method of treating the surface of an iron alloy material which comprises:
    nitriding said iron alloy material to form on said surface thereof a layer of a nitride composed of iron and nitrogen or a carbonitride composed of iron, carbon and nitrogen, and
    heating said iron alloy material at a temperature up to 580° C. with a material containing (a) at least one surface layer-forming element from the group consisting of Group Va elements of the periodic table and (b) a treating agent, so that said surface layer-forming element may be diffused into said surface of said iron alloy material to form thereon a surface layer composed of a nitride or carbonitride of said element;
    said treating agent being at least one compound selected from the group consisting of chlorides, fluorides, borofluorides, oxides, bromides, iodides, carbonates, nitrates and borates of alkali and alkaline earth metals, ammonium halides and metal halides.

12. A method as set forth in claim 11, wherein said nitriding is carried out by a method selected from gas nitriding, gas soft-nitriding, salt bath soft-nitriding and glow discharge nitriding.

13. A method as set forth in claim 11, wherein said material containing at least one surface layer-forming element is at least one material selected from the group consisting of said element in pure metallic form, an alloy containing said element and a compound containing said element.

14. A method as set forth in claims 11, wherein said heating is carried out by immersing said iron alloy material and said material containing said element in a molten bath composed of said treating agent.

15. A method as set forth in claims 11, wherein said heating is carried out by employing said iron alloy material as a cathode and conducting electrolysis in a molten bath composed of said treating agent and holding said material containing said element.

16. A method as set forth in claim 11, wherein said heating is carried out by placing said iron alloy material in a mixed powder composed of said treating agent and said material containing said element.

17. A method as set forth in claim 11, wherein said heating is carried out after a paste prepared from a mixed powder composed of said treating agent and said material containing said element has been applied to said iron alloy material.

18. A method as set forth in claim 11, wherein, when said iron alloy material is heated, it is kept away from contact with a mixed powder composed of said treating agent and said material containing said element.

19. A method as set forth in claim 11, wherein said iron alloy material is heated in fluidized mixed powder composed of said treating agent and said material containing said element.

20. A method as set forth in claim 11, wherein said heating is carried out at a temperature of at least 450° C.

* * * * *